United States Patent
Maruyama et al.

(10) Patent No.: US 7,084,422 B2
(45) Date of Patent: Aug. 1, 2006

(54) SEMICONDUCTOR LIGHT EMITTING DEVICE HAVING QUANTUM WELL LAYER SANDWICHED BETWEEN CARRIER CONFINEMENT LAYERS

(75) Inventors: Tsuyoshi Maruyama, Tokyo (JP); Kazuhisa Ishii, Tokyo (JP); Ken Sasakura, Tokyo (JP); Shotaro Tomita, Tokyo (JP); Keizo Kawaguchi, Tokyo (JP); Toshio Tomiyoshi, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 0 days.

(21) Appl. No.: 11/067,190

(22) Filed: Feb. 24, 2005

(65) Prior Publication Data

US 2005/0145857 A1 Jul. 7, 2005

Related U.S. Application Data

(62) Division of application No. 10/664,659, filed on Sep. 17, 2003, now Pat. No. 6,900,467.

(30) Foreign Application Priority Data

Oct. 23, 2002 (JP) ............................. 2002-308171

(51) Int. Cl.
*H01L 29/006* (2006.01)
(52) U.S. Cl. .......................................... 257/14; 257/78
(58) Field of Classification Search ................ 257/14, 257/78, 79, 90
See application file for complete search history.

(56) References Cited

U.S. PATENT DOCUMENTS 4,819,036 A   4/1989  Kuroda et al.
5,684,309 A * 11/1997  McIntosh et al. ........... 257/191

OTHER PUBLICATIONS

Jones, K. A., et al., "Accurately determining the composition and thickness of layers in a GaAs/InGaAs superlattice." Appl. Phys. 76 (3), Aug. 1, 1994, pp. 1609-1616.

(Continued)

*Primary Examiner*—David Nelms
*Assistant Examiner*—Thinh T Nguyen
(74) *Attorney, Agent, or Firm*—Frishauf, Holtz, Goodman & Chick, P.C.

(57) ABSTRACT

The principal surface of a substrate made of a group III-V compound semiconductor material is about a (100) plane. A light emitting lamination structure is disposed on the principal surface. In the light emitting lamination structure, a quantum well layer is sandwiched by a pair of carrier confinement layers made of a semiconductor material having a band gap wider than a semiconductor material of the quantum well layer. The pair of carrier confinement layers are sandwiched by a pair of clad layers made of a semiconductor material having a band gap wider than the band gap of the semiconductor material of the carrier confinement layers. Thicknesses of the quantum well layer and the carrier confinement layers, as well as compositions of the semiconductor materials thereof, are set such that light emission recombination of electrons and holes occurs in the quantum well layer and not in the carrier confinement layers.

7 Claims, 21 Drawing Sheets

OTHER PUBLICATIONS

Maier, M., et al., "Composition analysis of molecular beam epitaxy grown $In_yGa_{1-y}As/GaAs/Al_x Ga_{1-x}As$ quantum wells by determination of film thickness." J. Appl. Phys. 73 (8), Apr. 15, 1993, 0021-8979/93/083820-07, American Institute of Physics, pp. 3820-3826.

Pavesi, L. et al., "Photoluminescence of $Al_xGa_{1-x}As$ alloys." J. Appl. Phys. 75 (10), 0021-8979/94/75(10)4779/64, May 15, 1994.

* cited by examiner

FIG.15

Legend:
- ■ GaAs(100) JUST
- ◆ (100)2° off to (111)A
- ▲ (100)5° off to (111)A
- × (100)10° off to (111)A
- ◇ (100)2° off to (110)
- △ (100)5° off to (110)
- + GaAs(100) JUST (In COMPOSITION 0.18)

X-axis: GROWTH TEMPERATURE (°C)
Y-axis: HALF BAND WIDTH (arc sec)

FIG.18

| SAMPLE | InGaAs QUANTUM WELL LAYER | | SUBSTRATE |
|---|---|---|---|
| | In COMPOSITION RATIO | THICKNESS (nm) | |
| A | 0.12 | 5 | GaAs(100) JUST |
| B | 0.12 | 10 | GaAs(100) JUST |
| C | 0.12 | 15 | GaAs(100) JUST |
| D | 0.12 | 5 | GaAs(100)5° off to (111)A |
| E | 0.12 | 10 | GaAs(100)5° off to (111)A |
| F | 0.12 | 15 | GaAs(100)5° off to (111)A |
| G | 0.18 | 5 | GaAs(100) JUST |
| H | 0.18 | 10 | GaAs(100) JUST |
| I | 0.18 | 15 | GaAs(100) JUST |
| J | 0.18 | 5 | GaAs(100)5° off to (111)A |
| K | 0.18 | 10 | GaAs(100)5° off to (111)A |
| L | 0.18 | 15 | GaAs(100)5° off to (111)A |

FIG.22

| SAMPLE | SUBSTRATE | InGaAs QUANTUM WELL LAYER | | EL INTENSITY (mW) | HALF BAND WIDTH (nm) OF EL SPECTRUM | CUTOFF FREQUENCY (MHz) |
| --- | --- | --- | --- | --- | --- | --- |
| | | In COMPOSITION RATIO | THICKNESS (nm) | | | |
| W | GaAs(100) JUST | 0.12 | 5 | 2.2 | 46.3 | 81.9 |
| X | GaAs(100)5° off to (111)A | 0.12 | 5 | 2.1 | 57.6 | 79.0 |
| Y | GaAs(100) JUST | 0.25 | 3 | 2.0 | 56.8 | 105.1 |
| Z | GaAs(100)5° off to (111)A | 0.25 | 3 | 1.3 | 99.9 | 112.9 |

US 7,084,422 B2

SEMICONDUCTOR LIGHT EMITTING DEVICE HAVING QUANTUM WELL LAYER SANDWICHED BETWEEN CARRIER CONFINEMENT LAYERS

This application is a Div. of Ser. No. 10/664,659 Sep. 17, 2003 now U.S. Pat No. 6,900,467.

CROSS REFERENCE TO RELATED APPLICATION

The present application is a Divisional Application of U.S. application Ser. No. 10/664,659, which is based upon and claims the benefit of priority from and/or is related to prior Japanese Patent Application No. 2001-150610 filed on May 21, 2001 and Japanese Patent Application No. 2002-308171 filed on Oct. 23, 2002, the entire contents of which are incorporated herein by reference.

BACKGROUND OF THE INVENTION

A) Field of the Invention

The present invention relates to a semiconductor light emitting device, and more particularly to a semiconductor light emitting device which is suitable for light emission in the wavelength band providing a high reception sensitivity of a photodiode using silicon and is capable of both increasing a light emission output and raising a cutoff frequency.

B) Description of the Related Art

A double-hetero type light emitting diode having a Zn doped GaAs layer sandwiched between AlGaAs layers is known as a device for outputting light in the infrared band (infrared band from a wavelength of 92 nm to a shorter wavelength) providing a high reception sensitivity of a photodiode using silicon. If the Zn concentration of a GaAs layer is increased, the cutoff frequency of a light emitting diode can be raised. However, if the Zn concentration is increased, a light emission output lowers considerably.

SUMMARY OF THE INVENTION

An object of this invention is to provide a semiconductor light emitting device which is suitable for light emission in the infrared wavelength band providing a high reception sensitivity of a photodiode using silicon and is capable of raising a cutoff frequency without lowering a light emission output.

According to one aspect of the present invention, there is provided a semiconductor light emitting device comprising: a support substrate made of a first semiconductor material; a light emitting lamination structure disposed on the support substrate, the light emitting lamination structure comprising a quantum well layer made of a second semiconductor material, a pair of carrier confinement layers made of a third semiconductor material having a band gap wider than a band gap of the second semiconductor material and sandwiching the quantum well layer, and a pair of clad layers made of a fourth semiconductor material having a band gap wider than the band gap of the third semiconductor material and sandwiching layers comprising the quantum well layer and the pair of carrier confinement layers, wherein the second and third semiconductor materials and a thickness of the quantum well layer satisfy a condition that a difference of 100 meV or larger exists between an energy level of the carrier confinement layers at a conduction band lower end and a ground level of an electron in the quantum well layer; and electrodes for injecting carriers into the light emitting lamination structure.

A difference between an energy level of the carrier confinement layers at a conduction band lower end and a ground level of an electron in the quantum well layer is set to 100 meV or higher. It is therefore possible to prevent radiative recombination in the carrier confinement layers and raise a cutoff frequency.

According to another aspect of the present invention, there is provided a semiconductor light emitting device comprising: a support substrate made of a first semiconductor material; a light emitting lamination structure disposed on the support substrate, the light emitting lamination structure comprising a quantum well layer made of a second semiconductor material, a pair of carrier confinement layers made of a third semiconductor material having a band gap wider than a band gap of the second semiconductor material and sandwiching the quantum well layer, and a pair of clad layers made of a fourth semiconductor material having a band gap wider than the band gap of the third semiconductor material and sandwiching layers comprising the quantum well layer and the pair of carrier confinement layers, wherein the second and third semiconductor materials and thicknesses of the quantum well layer and the carrier confinement layers satisfy a condition that light emission recombination of electrons and holes occurs in the quantum well layer and light emission recombination does not occur in the carrier confinement layers when current flows through the light emitting lamination structure; and electrodes for injecting carriers into the light emitting lamination structure.

A cutoff frequency can be raised by preventing radiative recombination in the carrier confinement layers.

According to another aspect of the present invention, there is provided a semiconductor light emitting device comprising: a support substrate made of group III-V compound semiconductor and having a principal surface that is a (100) plane or a crystalline plane having an inclination angle of 2° or smaller from the (100) plane; a light emitting lamination structure disposed on the principal surface of the support substrate, the light emitting lamination structure comprising a quantum well layer made of group III-V mixed crystal semiconductor containing In, a pair of carrier confinement layers made of semiconductor material having a band gap wider than the quantum well layer and sandwiching the quantum well layer, and a pair of clad layers made of semiconductor material having a band gap wider than the carrier confinement layers and sandwiching layers comprising the quantum well layer and the pair of carrier confinement layers, wherein materials of the quantum well layer and the carrier confinement layers and a thickness of the quantum well layer satisfy a condition that a difference of 100 meV or larger exists between an energy level of the carrier confinement layers at a conduction band lower end and a ground level of an electron in the quantum well layer; and electrodes for injecting carriers into the light emitting lamination structure.

By using such a support substrate, the quality of each layer to be formed on the support substrate can be improved and a cutoff frequency can be raised without lowering a light emission output.

BRIEF DESCRIPTION OF THE DRAWINGS

FIG. 15 is a graph showing the relation between a growth temperature and a half band width of a satellite peak of a X-ray rocking curve, respectively of each sample lamination structure manufactured according to the second embodiment.

FIG. 18 is a table showing an In composition ratio and a thickness of an InGaAs strain quantum well layer and a plane of a principal surface, respectively of samples manufactured according to the third embodiment.

FIG. 22 is a table showing a plane of a principal surface of the substrate of each sample manufactured according to the fourth embodiment, an In composition ratio and a thickness of a strain quantum well layer, an EL intensity, a half band width of an EL spectrum and a cutoff frequency.

DESCRIPTION OF THE PREFERRED EMBODIMENTS

Figure 1:
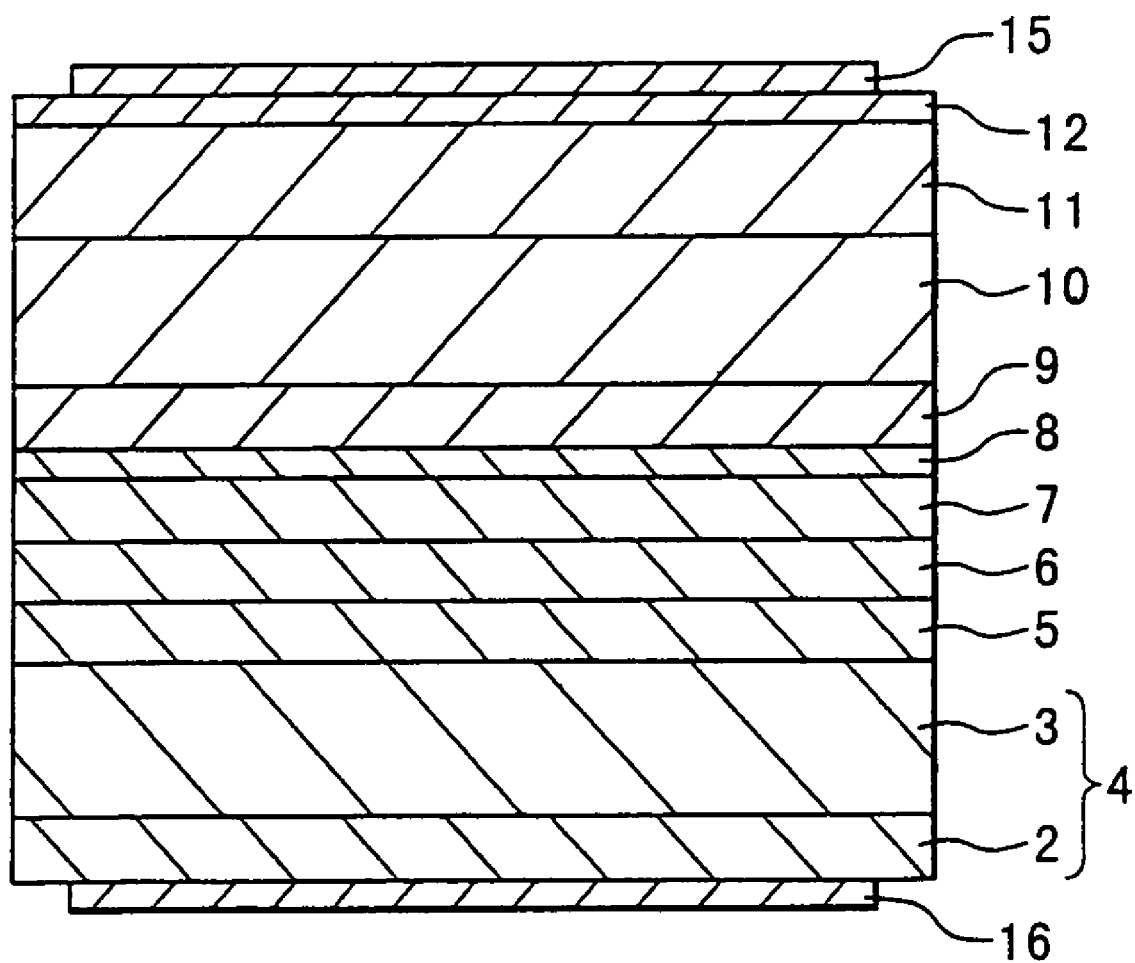
FIG. 1 is a schematic cross sectional view of a semiconductor light emitting device according to a first embodiment of the invention.

FIG. 1 is a cross sectional view of a semiconductor light emitting device according to the first embodiment of the invention. A support substrate 4 is made of a high concentration layer 2 and a low concentration layer 3. The support substrate 4 is made of Zn doped p-type $Al_{0.26}Ga_{0.74}As$. The Zn concentration of the high concentration layer 2 is $1\times10^{18}$ $cm^{-3}$ and the Zn concentration of the low concentration layer 3 is $5\times10^{17}$ $cm^{-3}$. A thickness of the high concentration layer 2 is 40 μm and a thickness of the low concentration layer 3 is 110 μm.

On the surface of the low concentration layer 3, layers from an AlGaAs buffer layer 5 to a GaAs contact layer 12 are formed by metal organic chemical vapor deposition (MOCVD). The buffer layer 5 is made of Zn doped p-type $Al_{0.26}Ga_{0.74}As$ and has a thickness of 0.2 μm and a Zn concentration of $1\times10^{18}$ $cm^{-3}$.

A lower clad layer 6 is made of Zn doped p-type $Al_{0.32}Ga_{0.68}As$ and has a thickness of 0.5 μm and a Zn concentration of $1\times10^{18}$ $cm^{-3}$. A lower carrier confinement layer (lower CCL layer) 7 is made of intentionally undoped $Al_{0.18}Ga_{0.82}As$ and has a thickness of 2 to 190 nm. A background concentration of the lower CCL layer 7 is $5\times10^{16}$ to $1\times10^{17}$ $cm^{-3}$.

A strain quantum well layer 8 is made of InGaAs and has a thickness of 2.4 to 15 nm and an In composition ratio of 0.12 to 0.25. An upper carrier confinement layer 9 is made of intentionally undoped $Al_{0.18}Ga_{0.82}As$ and has a thickness of 2 to 190 nm. A background concentration of the upper carrier confinement layer 9 is $5\times10^{16}$ to $1\times10^{17}$ $cm^{-3}$. An upper clad layer 10 is made of Si doped n-type $Al_{0.32}Ga_{0.68}As$ and has a thickness of 5.5 μm and an Si concentration of $1\times10^{18}$ $cm^{-3}$.

A current diffusion layer 11 is made of Si doped n-type $Al_{0.18}Ga_{0.82}As$ and has a thickness of 4.5 μm and an Si concentration of $1\times10^{18}$ $cm^{-3}$. A contact layer 12 is made of Si doped n-type GaAs and has a thickness of 0.1 μm and an Si concentration of $2\times10^{18}$ $cm^{-3}$.

On the contact layer 12, an Ni layer, a Ge layer and an Au layer are stacked in this order from the bottom to form an n-side electrode 15. The n-side electrode 15 is formed by a lift-off method to have, for example, an X-character plan shape. On the surface of the high concentration layer 2 partially constituting the support layer 4, an Au layer and an AuZn alloy layer are stacked in this order from the support layer 4 side to form a p-side electrode 16. The p-side electrode 16 is formed by a lift-off method to have, for example, a honeycomb shape.

Next, with reference to FIG. 2, description will be made on a method of manufacturing the underlying substrate 4 used with the semiconductor light emitting device of the first embodiment.

Figure 2A:
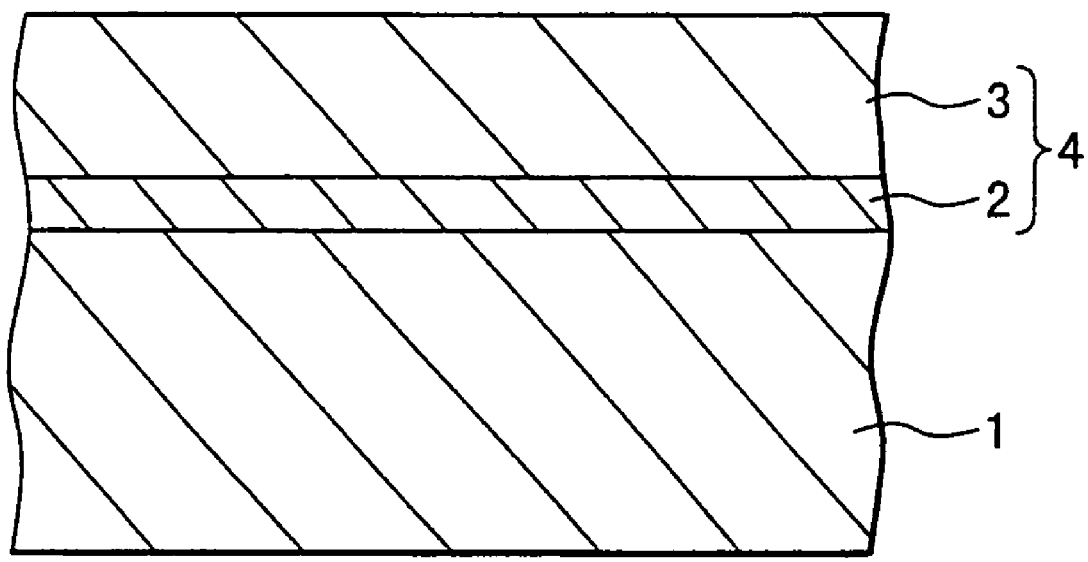
FIGS. 2A and 2B are cross sectional views illustrating a method of manufacturing a support substrate of a semiconductor light emitting device of the first embodiment.

A temporary substrate 1 made of GaAs shown in FIG. 2A is prepared. The principal surface of the temporary substrate 1 has the GaAs (100) plane. The temporary substrate 1 is doped with Zn to have a p-type conductivity whose concentration is $2 \times 10^{19}$ cm$^{-3}$ to $5 \times 10^{19}$ cm$^{-3}$.

On the principal surface of the temporary substrate 1, the high concentration layer 2 and low concentration layer 3 are sequentially grown by liquid phase epitaxial growth (LPE), the high concentration layer 2 and low concentration layer 3 being made of Al$_{0.26}$Ga$_{0.74}$As and having a thickness of 40 μm and 150 μm, respectively. These two layers constitute the support substrate 4. A temperature difference method and a slow cooling method are mainly used as LPE. In this embodiment, the temperature difference method was adopted. By adopting the temperature difference method, the Al composition ratio of the support substrate 4 can be made generally uniform. For example, a slide boat type may be used as the growth system. During the growth, Zn is doped into the high and low concentration layers 2 and 3 to set the Zn concentration to $1 \times 10^{18}$ cm$^{-3}$ and $5 \times 10^{17}$ cm$^{-3}$, respectively.

Solution used for the growth is GaAs, Al and Zn dissolved in Ga solvent. The temperature gradient in the vertical direction of the growth solution filled in a melting vessel is about 5° C./cm, and the temperature of the growth solution in the lower region in contact with a seed crystal is 830 to 850° C. The temperature and temperature gradient of the growth solution in the lower region are maintained generally constant during the growth.

Figure 2B:
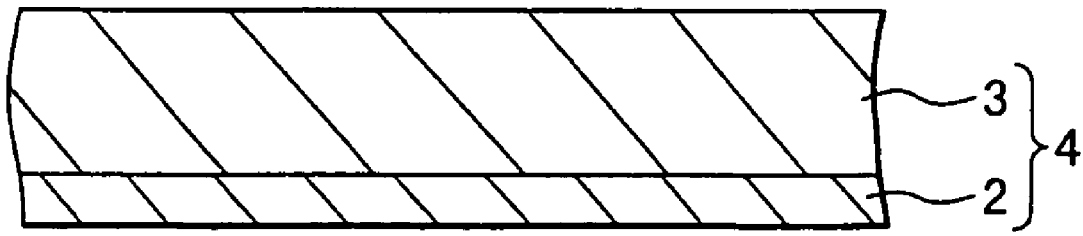

Processes up to the state shown in FIG. 2B will be described. The GaAs temporary substrate 1 shown in FIG. 2A is etched and removed. Only the support substrate 4 is therefore left. The GaAs temporary substrate 1 can be etched by using etchant of a mixture of aqueous ammonia and aqueous hydrogen peroxide at a volume ratio of 1:20. A concentration of aqueous ammonia is 28 wt. % and that of aqueous hydrogen peroxide is 31 wt. %.

Next, the surface of the low concentration layer 3 is ground to mitigate an irregular surface. In addition, the ground surface is polished to remove process damages and a final process is performed by chemical mechanical polishing (CMP). Generally, a semiconductor layer grown by the temperature difference method has worse surface planarization than a semiconductor layer grown by the slow cooling method. By performing CMP as the final process, the surface planarization can be improved. With the processes described above, the support substrate 4 can be stained.

A forward bias is applied between the n- and p-side electrodes 15 and 16 to inject carriers into the strain quantum well layer 8 so that light emission in the infrared band (wavelength from 800 to 920 nm) is possible.

In the semiconductor light emitting device of the first embodiment, the support substrate 4 of AlGaAs is used as a substrate having a physical support force and as a seed crystal for MOCVD. Since GaAs is not used as the material of the substrate, light can be emitted not only from the contact layer 12 side shown in FIG. 1 but also from the support substrate 4 side. The contact layer 12 made of GaAs does not obstruct light pick-up because it is removed by acid treatment of a later chip dicing process. Removing the temporary substrate 1 is particularly effective if the wavelength at which a peak of the light emission spectrum of the strain quantum well layer 8 is shorter than the wavelength corresponding to the band gap of the semiconductor material of the temporary substrate 1.

The lower carrier confinement layer 7, strain quantum well layer 8 and upper carrier confinement layer 9 are formed by MOCVD. Uniformity of film thicknesses can therefore be improved and a higher light emission efficiency can be realized, as compared to that these layers are formed by LPE. Instead of MOCVD, molecular beam epitaxy (MBE) growth may be used.

Next, description will be made on the preferable conditions for improving the light emission intensity and operation speed of a semiconductor light emitting device of the first embodiment.

Figure 3:
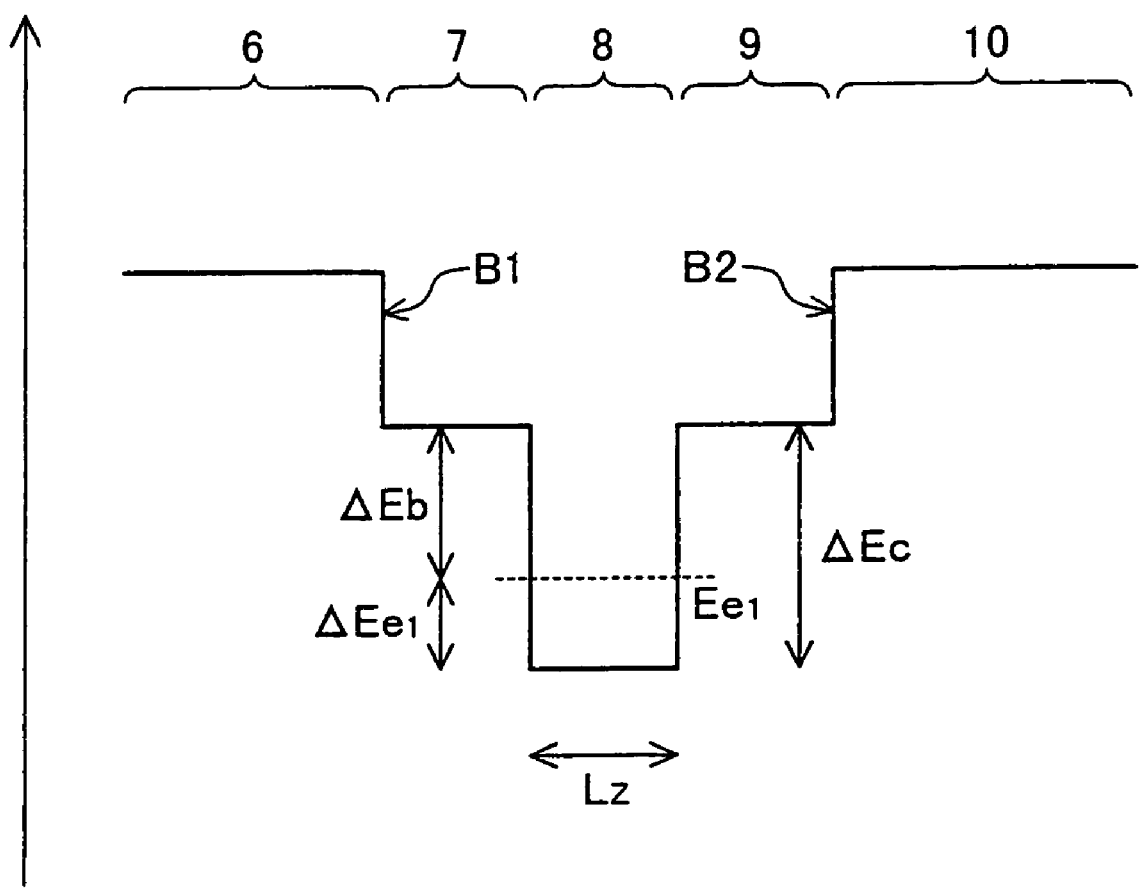
FIG. 3 is an energy band diagram of a lamination structure of a semiconductor light emitting device of the first embodiment on the conduction band side, the lamination structure comprising layers from a lower clad layer to an upper clad layer.

FIG. 3 is an energy band diagram on the conduction band side of the lamination from the lower clad layer 6 to the upper clad layer 10. A thickness of the strain quantum well layer 8 is represented by Lz, a ground level of an electron in the strain quantum well layer 8 is represented by Ee$_1$, an energy difference between a level at the conductive band lower end of the strain quantum well layer 8 and the electron ground level Ee$_1$ is represented by ΔEe$_1$, an energy difference between a level at the conductive band lower end of the lower and upper carrier confinement layers 7 and 9 and the electron ground level Ee$_1$ is represented by ΔEb, and an energy difference between a level at the conductive band lower end of the lower and upper carrier confinement layers 7 and 9 and a level at the conductive band lower end of the strain quantum well layer 8 is represented by ΔEc.

Electrons injected from the upper clad layer 10 into the upper carrier confinement layer 9 are confined in the three layers from the lower carrier confinement layer 7 to the upper carrier confinement layer 9, because of the existence of a potential barrier B$_1$ at the interface between the lower clad layer 6 and lower carrier confinement layer 7 and a potential barrier B$_2$ at the interface between the upper clad layer 10 and upper carrier confinement layer 9. Light emission occurs when the confined electrons are captured by the ground level Ee$_1$ of electrons in the strain quantum well layer 8 and recombined with holes in the valence band.

If the band gap of the carrier confinement layers 7 and 9 is made narrow to make small the energy difference ΔEb, light emission due to recombination of electrons and holes occurs even in the carrier confinement layers 7 and 9. This light emission has a slower response speed than light emission in the strain quantum well layer 8. In order to improve the response speed of the semiconductor light emitting device, it is necessary to suppress the light emission in the carrier confinement layers 7 and 9.

If the band gap of the carrier confinement layers 7 and 9 is made broad to make large the energy difference ΔEb, the potential barriers B$_1$ and B$_2$ are lowered. The electron confinement effects are therefore reduced. It can therefore be considered that the energy difference ΔEb greatly influences the light emission efficiency and the response speed.

In the following, description will be made on how the energy difference ΔEb (=ΔEc−ΔEe$_1$) is calculated. An energy difference between a level at the conduction band lower end of the strain quantum well layer 8 and an n-th order level Ee$_n$ in the strain quantum well layer 8 is represented by ΔEe$_n$, an effective mass of an electron in the strain quantum well layer 8 is represented by me$_1$*, an effective mass of an electron in the carrier confinement layers 7 and 9 is represented by me$_2$* and the Planck's constant is represented by h. With these definitions, the following equations (1) are satisfied if the order n is odd. These equations are satisfied on the assumption that the carrier confinement layers 7 and 9 are sufficiently thick as compared to a penetration depth (about several nm, although it depends upon the well structure) of wave function of electrons into the carrier confinement layers 7 and 8.

$$(\alpha Lz/2)\tan(\alpha Lz/2)=(\beta Lz/2)(me_1^*/me_2^*)$$

$$\alpha^2=2(me_1^*)\Delta Ee_n/(h/2\pi)^2$$

$$\beta^2=2(me_2^*)(\Delta Ec-\Delta Ee_n)/(h/2\pi)^2 \quad (1)$$

A band gap $Eg_1$ of $In_{1-x}Ga_xAs$ is generally given by the following equation (2):

$$Eg_1=1.422-1.53(1-x)+0.45(1-x)^2 \quad (2)$$

The effective mass $me_1^*$ of an electron in the conduction band is given by the following equation (3):

$$me_1^*/me_0=0.0225(1-x)+0.0665x \quad (3)$$

where $me_0$ is rest mass of a free electron. The equation (2) is derived without considering the strain amount of the strain quantum well layer 8.

If strain is applied to the InGaAs well layer, the energy gap changes. This change amount $\Delta Eg_1$ is given by:

$$\Delta Eg_1=[-2a(C_{11}-C_{12})/C_{11}+b(C_{11}+2C_{12})/C_{11}]\epsilon \quad (4)$$

where a and b are a strain potential, $C_{11}$ and $C_{12}$ are an elastic stiffness constant, $\epsilon$ is an elastic strain to be caused by lattice mismatch between the well layer and carrier confinement layer. The elastic strain $\epsilon$ is given by:

$$\epsilon=(Aw-Ab)/Ab \quad (5)$$

where Aw is a lattice constant of $In_{1-x}Ga_xAs$, and Ab is a lattice constant of $Al_zGa_{1-z}As$. The lattice constants Aw and Ab, strain potentials a and b and elastic stiffness constants $C_{11}$ and $C_{12}$ are given by the following equations (6):

$$Aw=0.56533x+0.60584(1-x) \text{ [nm]}$$

$$Ab=0.56533(1-z)+0.015z \text{ [nm]}$$

$$a=-5.8(1-x)-9.8x \text{ [eV]}$$

$$b=-1.8(1-x)-1.76x \text{ [eV]}$$

$$C_{11}=0.833(1-x)+1.188x \text{ [}\times 10^{12} \text{ dyn/cm}^2\text{]}$$

$$C_{12}=0.432(1-x)+0.532x \text{ [}\times 10^{12} \text{ dyn/cm}^2\text{]} \quad (6)$$

The above equations (2), (3) and (6) are described in J. Appl. Phys. 76(3), 1 Aug. 1994, p. 1609–1616 by K. A. Jones.

The band gap $Eg_2$ of $Al_zGa_{1-z}As$ is given by the following equation (7):

$$Eg_2=1.425+1.444z \quad (7)$$

The effective mass $me_2^*$ of an electron in the conduction band is given by the following equation (8):

$$me_2^*/me_0=0.0665(1-z)+0.15z \quad (8)$$

The above equations (7) and (8) are described in J. Appl. Phys. 75(10), 15 May 1994, p. 4779–4842 by Lorenzo Pavesi.

If the carrier confinement layers 7 and 9 are made of AlGaAs and the strain quantum well layer 8 is made of InGaAs, the band gap difference $\Delta Eg$ is $Eg_2-(Eg_1+\Delta Eg_1)$ and the energy difference $\Delta Ec$ is given by the following approximate equation (9):

$$\Delta Ec=0.57\Delta Eg \quad (9)$$

If the carrier confinement layers 7 and 9 are made of GaAs and the strain quantum well layer 8 is made of InGaAs, the energy difference $\Delta Ec$ is given by the following approximate equation (10):

$$\Delta Ec=0.62\Delta Eg \quad (10)$$

The above equations (9) and (10) are described in J. Appl. Phys. 73(8), 15 Apr. 1993, p. 3820–3826 by M. Maier.

If the carrier confinement layers 7 and 9 are made of AlGaAs and the strain quantum well layer 8 is made of GaAs, the energy difference $\Delta Ec$ is given by the following approximate equation (11):

$$\Delta Ec=0.62\Delta Eg \quad (11)$$

Semiconductor light emitting devices shown in FIG. 1 were manufactured by using various combinations of the In composition ratio (1-x) and Al composition ratio z. The energy difference $\Delta Eb$ of each semiconductor light emitting device was calculated and the cutoff frequency was measured. The energy difference side $\Delta Eb$ can be calculated from the equation (1) and the equation of $\Delta Eb=\Delta Ec-\Delta Ee_1$. The cutoff frequency was measured by the following method.

AC current of 10 mA superposed upon forward DC current of 50 mA is flowed through the semiconductor light emitting device. The cutoff frequency fc is defined as a frequency of AC current at which the amplitude of an light output lowers by -3 dB from the amplitude of a light output at an AC current frequency $f_0$, where $f_0=(1/100)fc$.

Figure 4:
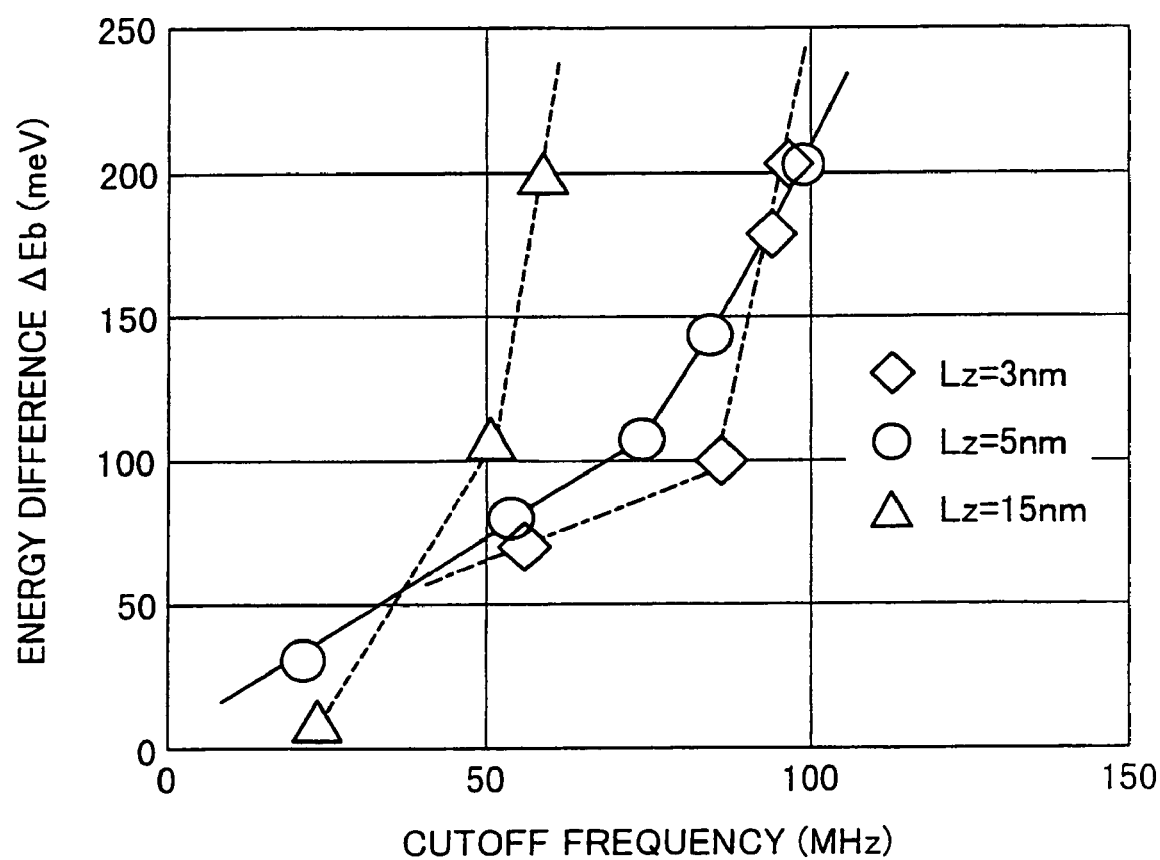
FIG. 4 is a graph showing the relation between an energy difference ΔEb and a cutoff frequency of semiconductor light emitting devices of the first embodiment.

FIG. 4 shows the relation between an energy difference $\Delta Eb$ and a cutoff frequency. The abscissa represents the cutoff frequency in the unit of "MHz" and the ordinate represents the energy difference $\Delta Eb$ in the unit of "meV". In FIG. 4, rhomboid, circle and triangle symbols represent the strain quantum well layers 8 having thicknesses of 3 nm, 5 nm and 15 nm, respectively.

As the energy difference $\Delta Eb$ becomes small, the cutoff frequency lowers. In the case of the strain quantum well layer 8 having the thickness of 5 nm among others, the gradient of the graph changes at the point where the energy difference $\Delta Eb$ is 100 meV. In the case of both the strain quantum well layers having the thicknesses of 3 nm and 15 nm, there is the tendency that the gradient of the graph changes at the point where the energy difference $\Delta Eb$ is 100 meV.

In each of the semiconductor light emitting devices, at the energy difference $\Delta Eb$ of 100 meV or smaller, the cutoff frequency tends to lower more quickly. This may be ascribed to that recombination of electrons and holes starts in the carrier confinement layers 7 and 9 because of the small energy difference $\Delta Eb$.

Figure 5:
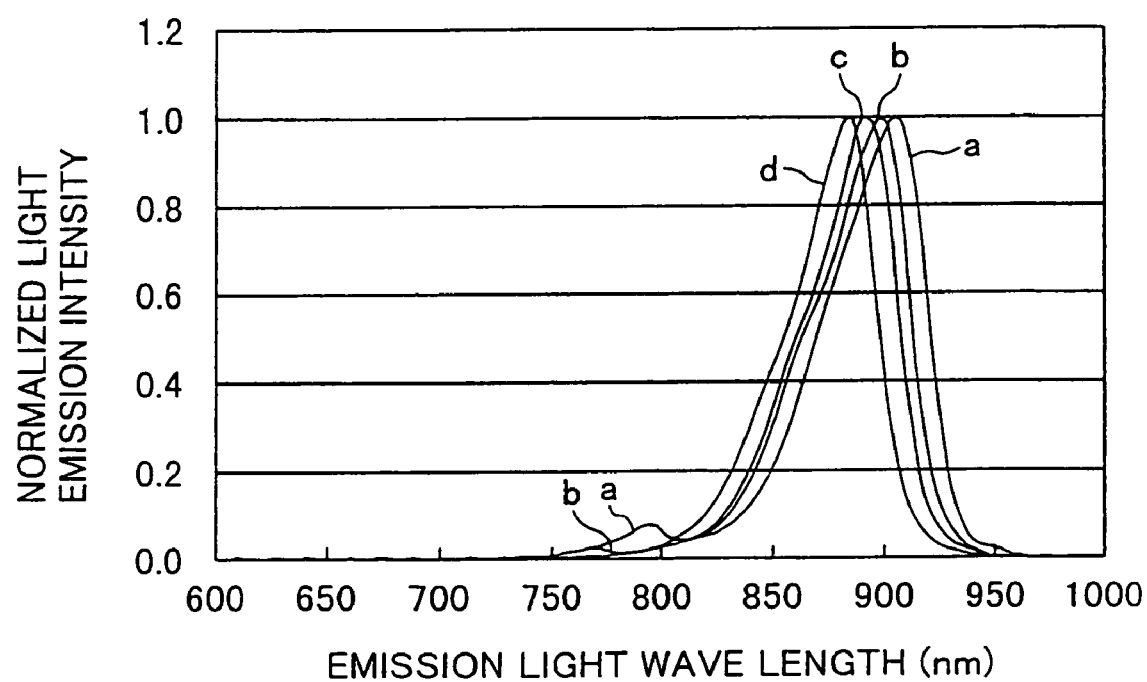
FIG. 5 is a graph showing light emission spectra of various samples having different Al composition ratios of carrier confinement layers of semiconductor light emitting devices of the first embodiment.

FIG. 5 shows light emission spectra of various samples having different Al composition ratios z of the carrier confinement layers ($Al_zGa_{1-z}As$) 7 and 9. The abscissa represents an emission light wavelength in the unit of "nm" and the ordinate represents a normalized light emission intensity. The normalized light emission intensity "1" corresponds to the largest light emission intensity. In FIG. 5, curves a to d are light emission spectra corresponding to the Al composition ratios of 0.09, 0.13, 0.18 and 0.26, respectively. The strain quantum well layer 8 of each sample has an In composition ratio of 0.12 and a thickness of 5 nm. The Al composition ratio of the current diffusion layer 11 is set to 0.32 so that light emission is not absorbed in the current diffusion layer 11.

As the Al composition ratio z of the carrier confinement layers 7 and 9 becomes small, the energy difference $\Delta Eb$ becomes small and the light emission wavelength shifts to the longer wavelength side. The energy differences ΔEb of the samples a to d are 80 meV, 107 meV, 143 meV and 202 meV, respectively.

Sub-peaks are observed neat at the wavelength of 800 nm of the curve a and near at the wavelength of 770 nm of the curve b. The sub-peaks observed on the shorter wavelength side than the main peaks means light emission in the carrier confinement layers 7 and 9. As the energy difference ΔEb becomes large, sub-peaks cannot be observed. Therefore, in order to obtain a high cutoff frequency, it is preferable that the energy difference ΔEb is set to 100 meV or higher. If the energy difference ΔEb is set to 110 meV, it is possible to manufacture the semiconductor light emitting device having a high cutoff frequency without a sub-peak. As indicated by the equations (1), the energy difference ΔEb can be identified approximately from the thickness of the strain quantum well layer 8 and the semiconductor materials of the strain quantum well layer 8 and carrier confinement layers 7 and 9.

Figure 6:
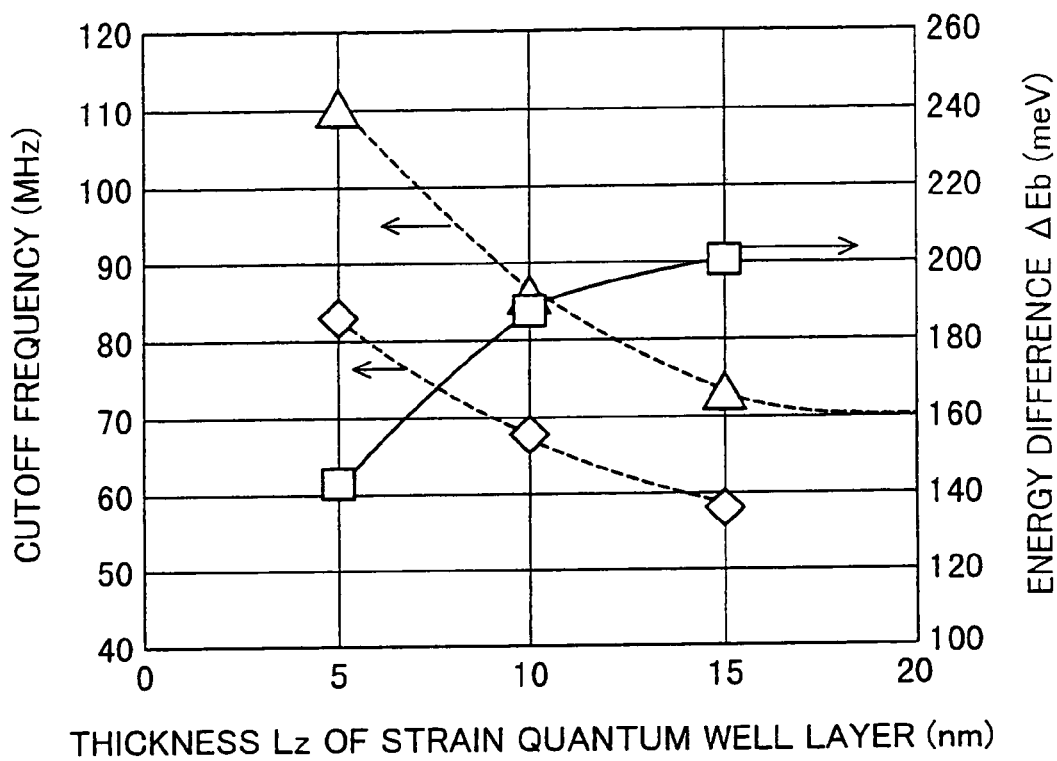
FIG. 6 is a graph showing the relation between a thickness of a strain quantum well layer and a cutoff frequency of semiconductor light emitting devices of the first embodiment.

FIG. 6 is a graph showing the relation between a thickness and a cutoff frequency of the strain quantum well layer 8, as compared to the energy difference ΔEb. The abscissa represents a thickness of the strain quantum well layer 8 in the unit of "nm", the left ordinate represents a cutoff frequency in the unit of "MHz" and the right ordinate represents an energy difference ΔEb in the unit of "meV". Evaluated samples had 5 nm, 10 nm and 15 nm as the thicknesses of the strain quantum well layer 8. The strain quantum well layer 8 of each sample has the In composition ratio of 0.12, and the carrier confinement layers 7 and 9 of each sample have the Al composition ratio of 0.18.

A square symbol in FIG. 6 indicates the energy difference ΔEb. Triangle and rhomboid symbols indicate cutoff frequencies at bias current values of 100 mA and 50 mA, respectively. Each sample has a square shape having one side length of 300 μm.

As the strain quantum well layer 8 is made thick, the cutoff frequency lowers even if the energy difference ΔEb is large. For example, in order to realize a communication speed of 100 Mbps in the NRZ communication system, it is required to set the cutoff frequency to about 70 MHz or higher. If the thickness of the strain quantum well layer 8 is 15 nm or thinner, the cutoff frequency can be set to 70 MHz or higher by flowing a bias current of 100 mA.

Figure 7:
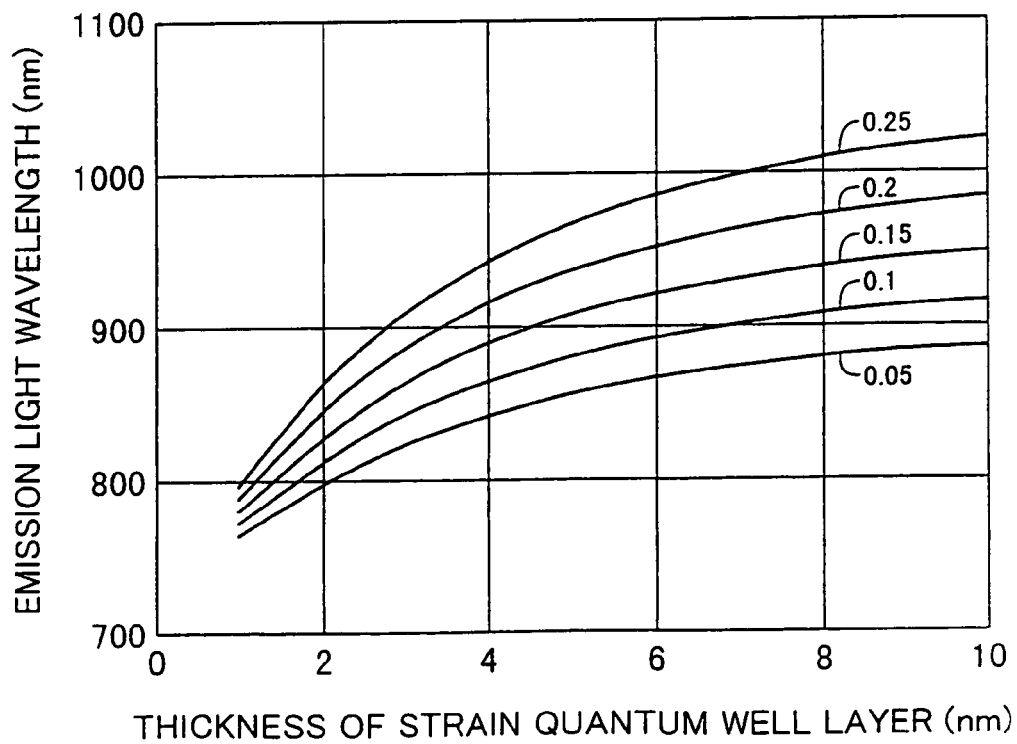
FIG. 7 is a graph showing the relation between a thickness of a strain quantum well layer and an emission light wavelength of semiconductor light emitting devices of the first embodiment.

FIG. 7 is a graph showing the relation between a thickness and an emission light wavelength of strain quantum well layers 8, using as a parameter five In composition ratios (1−x) of the strain quantum well layers 8. The abscissa represents a thickness of the strain quantum well layer 8 in the unit of "nm" and the ordinate represents an emission light wavelength in the unit of "nm".

Numerical values appended to solid lines in FIG. 7 represent the In composition ratio. The Al composition ratio of the carrier confinement layers 7 and 9 is 0.18.

It can be seen from the graph that as the In composition ratio of the strain quantum well layer 8 is made larger, the emission light wavelength becomes long and that as the strain quantum well layer 8 is made thick, the emission light wavelength becomes long. In order to receive light with a photodiode using silicon, it is preferable to set the emission light wavelength in a range from 800 nm to 920 nm. In order to make the In composition ratio of the strain quantum well layer 8 larger than 0.25 and set the emission light wavelength in a range from 800 nm to 920 nm, it is necessary to make the strain quantum well layer 8 thinner than about 3 nm. Such thin semiconductor light emitting devices are difficult to be manufactured with good reproductivity. If the In composition ratio is large, the gradient of the curve is steep in the emission light wavelength range from 800 to 920 nm. Therefore, even a small variation in the thickness of the strain quantum well layer 8 changes the emission light wavelength greatly. It is therefore preferable that the In composition ratio of the strain quantum well layer 8 is set to 0.25 or smaller.

As the In composition ratio is made small, light emission at a wavelength of 800 nm to 920 nm can be expected even if the strain quantum well layer 8 is made comparatively thick. However, as described with reference to FIG. 6, as the strain quantum well layer 8 is made thick and the In composition ratio is made small, the cutoff frequency lowers.

Figure 8:
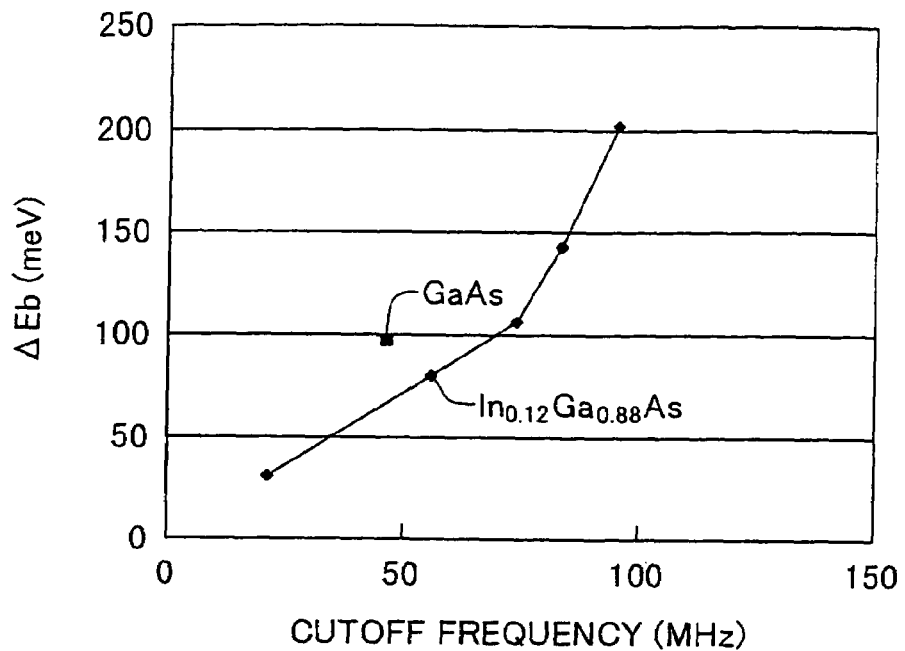
FIG. 8 is a graph showing the relation between a cutoff frequency and an energy difference ΔEb of a semiconductor light emitting device of the first embodiment.

FIG. 8 shows the relation between a cutoff frequency and an energy difference ΔEb. The abscissa represents a cutoff frequency in the unit of "MHz" and the ordinate represents an energy difference ΔEb in the unit of "meV". A rhomboid symbol in FIG. 8 corresponds to the semiconductor light emitting device using the strain quantum well layer 8 having the In composition ratio of 0.12, and a square symbol corresponds to the semiconductor light emitting device using a GaAs well layer. As seen from the graph, as the energy difference ΔEb increases, the cutoff frequency of the semiconductor light emitting device using the InGaAs strain quantum well layer becomes high. A higher cutoff frequency is obtained by using InGaAs than by using GaAs as the material of the quantum well layer. In order to maintain high the cutoff frequency, it is therefore preferable to use $In_{1-x}Ga_xAs$ (0<x<1) as the material of the strain quantum well layer 8 and to set the In composition ratio to 0.05 or higher.

Figure 9:
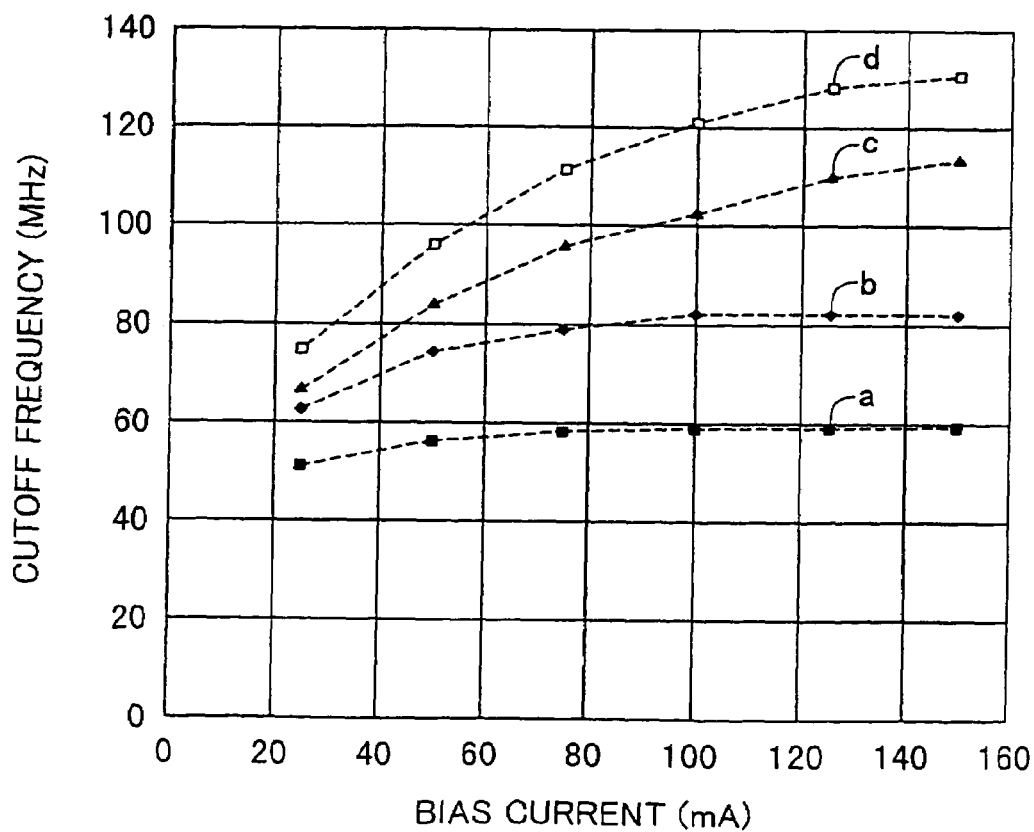
FIG. 9 is a graph showing the relation between a bias current and a cutoff frequency of semiconductor light emitting devices of the first embodiment, using as a parameter an Al composition ratio of a carrier confinement layer.

FIG. 9 shows the relation between a cutoff frequency and a bias current of a plurality of samples having different Al composition ratios of the carrier confinement layers 7 and 9. The abscissa represents a bias current in the unit of "mA" and the ordinate represents a cutoff frequency in the unit of "MHz". Curves a to d in FIG. 9 indicate the cutoff frequencies corresponding to the Al composition ratios of 0.09, 0.13, 0.18 and 0.26, respectively. The strain quantum well layer 8 has the In composition ratio of 0.12 and a thickness of 5 nm. At the Al composition ratios of 0.09 and 0.13, the cutoff frequency becomes approximately highest near at a bias current of 100 mA. Even if the bias current is increased more, the cutoff frequency is not raised and saturates. As seen from the graph, as the Al composition ratio is set larger than 0.13, the cutoff frequency is hard to be saturated when the bias current is increased. If the bias current is set to 40 mA or larger, a cutoff frequency of 70 MHz or higher can be obtained under the condition of the Al composition ratio of 0.13 or larger.

Figure 10:
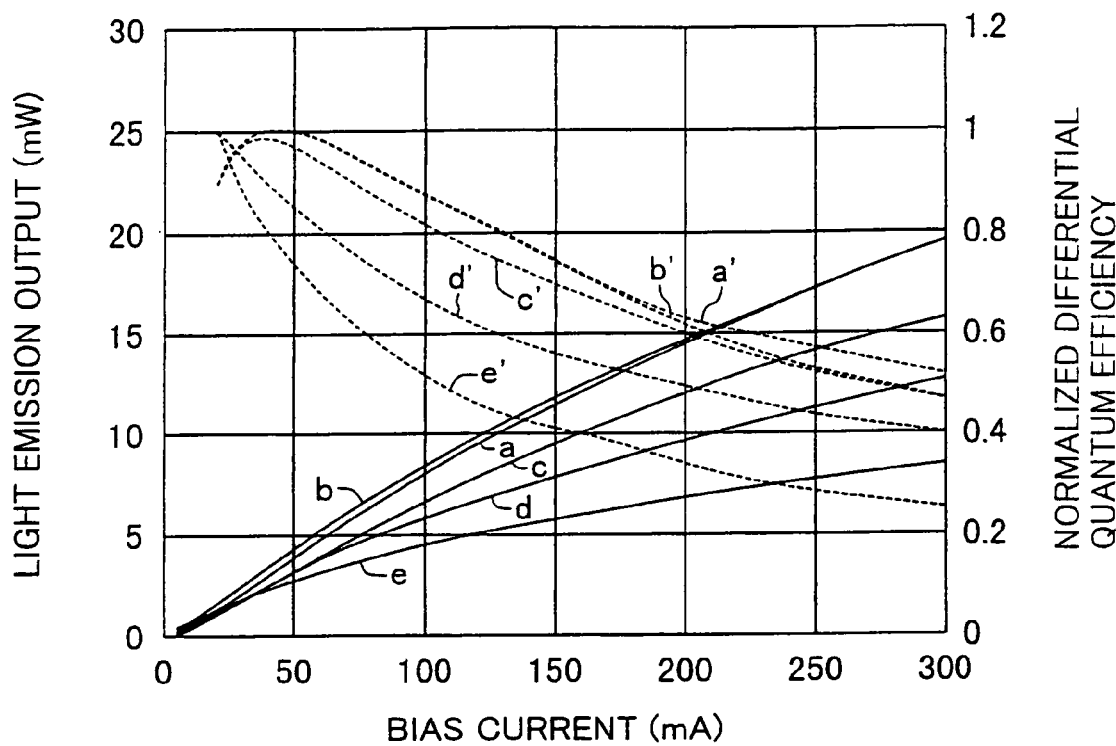
FIG. 10 is a graph showing the relation between a bias current and a normalized light output of semiconductor light emitting devices of the first embodiment, compared to a normalized differential quantum efficiency and using as a parameter an Al composition ratio of a carrier confinement layer.

FIG. 10 shows the relation between a bias current and a light emission output of a plurality of samples having different Al composition ratios of the carrier confinement layers 7 and 9, as compared to a normalized differential quantum efficiency. The abscissa represents a bias current in the unit of "mA", the left ordinate represents a light emission output in the unit of "mW" and the right ordinate represents a normalized differential quantum efficiency. The differential quantum efficiency means a gradient of a straight line interconnecting adjacent measurement points of each curve representative of the relation between the bias current (I) and light emission output (p). The differential quantum efficiency is calculated from the following equation (12):

$$(dp/dI)_n = (p_n - p_{n-1})/(I_n - I_{n-1}) \tag{12}$$

where n is an integer from 1 to the number of measurement points.

The normalized differential quantum efficiency "1" corresponds to a maximum differential quantum efficiency. Solid lines a to e in FIG. 10 indicate the light emission outputs with the Al composition ratios of the carrier confinement layers 7 and 9 being set to 0.09, 0.13, 0.18, 0.26 and 0.32, respectively. Broken lines a' to e' indicate the normalized differential quantum efficiencies with the Al composition ratios of the carrier confinement layers 7 and 9 being set to 0.09, 0.13, 0.18, 0.26 and 0.32, respectively.

As the bias current is increased, the light emission output increases and the normalized differential quantum efficiency corresponding to the gradient of the light emission output curve lowers. As the Al composition ratio is made small, there is a tendency that the light emission output increases, and the normalized differential quantum efficiency becomes large. If the Al composition ratio is 0.32 same as that of the clad layer, an abrupt reduction of the normalized differential quantum efficiency is observed and an increase rate of the light emission output is small even if the bias current is made larger than 150 mA. This may be ascribed to that the potential barriers $B_1$ and $B_2$ shown in FIG. 3 lower and the carrier confinement effects are degraded.

It can be seen from FIG. 10 that in order to obtain a sufficient light emission output, the Al composition ratio of the carrier confinement layers 7 and 9 is preferable set lower then that of the clad layer. A high cutoff frequency and a large light emission output are required for an infrared light emitting device to be used by optical communications in order to speed up the communication speed and make an available communication distance longer. In order to obtain a large light emission output, a communication light emitting device often uses a large current of 200 mA or larger which is not used by a visible light LED for general illumination. In order to obtain a stable and high normalized differential quantum efficiency even at such a large current, it is preferable to set the Al composition ratio smaller than 0.26. In this state, the band gap difference $\Delta Eg$ is 84 meV between the carrier confinement layers 7 and 9 (Al composition ratio of 0.26) and the clad layer (Al composition ratio of 0.32). The height of the potential barriers $B_1$ and $B_2$ is 55 meV as calculated from $\Delta Ec=0.65\Delta Eg$. Namely, it is preferable that the height of the potential barrier between the clad layer and carrier confinement layer is set to 55 meV or higher.

Figure 11:
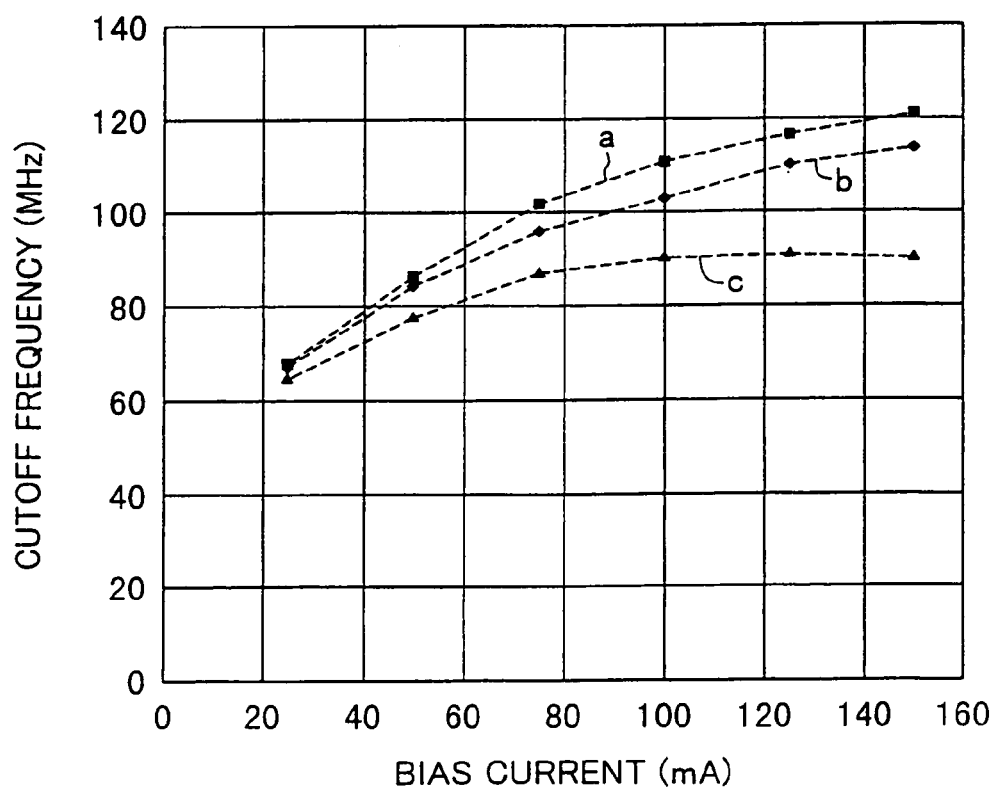
FIG. 11 is a graph showing the relation between a bias current and a cutoff frequency of semiconductor light emitting devices of the first embodiment, using as a parameter a thickness of each carrier confinement layer.

FIG. 11 shows the relation between a bias current and a cutoff frequency of a plurality of samples having different thicknesses of the carrier confinement layers 7 and 9. The abscissa represents a bias current in the unit of "mA" and the ordinate represents a cutoff frequency in the unit of "MHz". Curves a to c in FIG. 11 correspond to semiconductor light emitting devices whose carrier confinement layers 7 and 9 have the thicknesses of 30 nm, 50 nm and 120 nm, respectively. As seen from the graph, as the bias current is increased, the cutoff frequency becomes high. However, with the carrier confinement layers 7 and 9 having a thickness of 120 nm, the bias current is saturated at 100 mA or larger. It is therefore preferable to set the thickness of the carrier confinement layers 7 and 9 thinner than 120 nm. In order to present sufficient carrier confinement effects, the thickness of the carrier confinement layers 7 and 9 is preferably set to 10 nm or thicker.

In the semiconductor light emitting device described above, although the number of strain quantum well layers 8 is 1, two or more strain quantum well layers 8 may be used.

Figure 12:
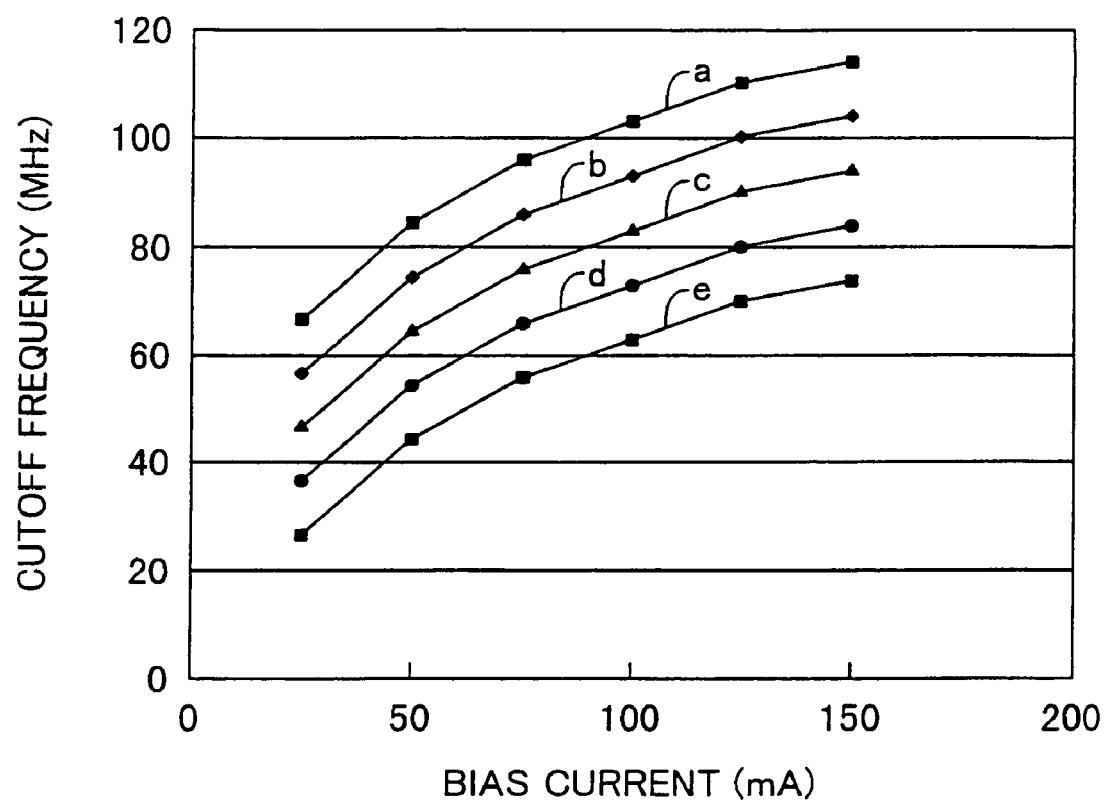
FIG. 12 is a graph showing the relation between a bias current and a cutoff frequency of semiconductor light emitting devices of the first embodiment, using as a parameter the number of quantum wells.

FIG. 12 shows the relation between a bias current and a cutoff frequency of samples whose number of strain quantum well layers are 1, 2, 3, 5 and 10. The abscissa represents a bias current in the unit of "mA" and the ordinate represents a cutoff frequency in the unit of "MHz". The thickness of the strain quantum well layer of each sample is 5 nm, and the In composition ratio is 0.12. The thickness of the carrier confinement layer is 50 nm and the Al composition ratio is 0.18. If a plurality of strain quantum well layers are used, the thickness of the barrier layer disposed between strain quantum well layers is 10 nm and the Al composition ratio is the same as that of the carrier confinement layer. The chip size is 400 μm×400 μm.

It can be seen that the cutoff frequency becomes high as the number of strain quantum well layers is reduced. As the bias current is increased, the light emission output is saturated at a certain intensity. As the number of strain quantum well layers is increased, the saturated value of the light emission output can be raised. Therefore, the number of strain quantum well layers is selected in terms of necessary cutoff frequency and light emission output. The number of strain quantum well layers is preferable set to 1 or 2 in order to obtain the cutoff frequency of 70 MHz and achieve the transmission speed of 100 Mbps.

Figure 13:
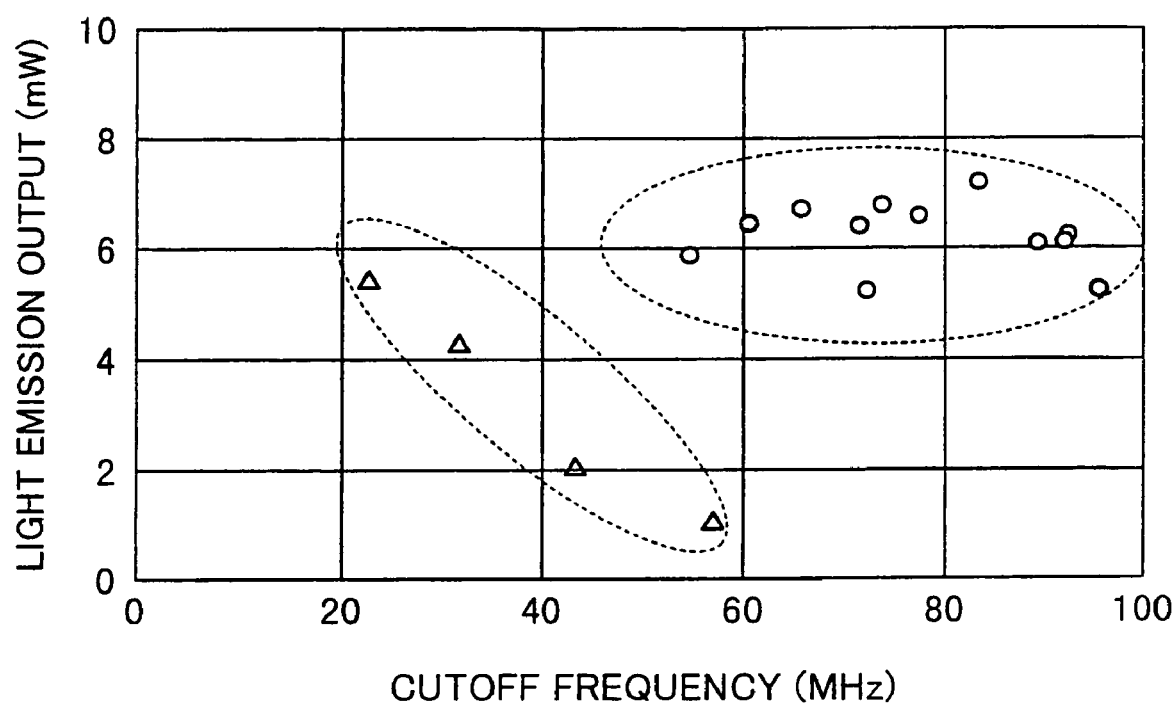
FIG. 13 is a graph showing a distribution of a cutoff frequency and a light emission output of semiconductor light emitting devices of the first embodiment and conventional semiconductor light emitting devices.

FIG. 13 shows the distribution of cutoff frequencies and light emission outputs of conventional light emitting diodes and semiconductor light emitting devices (light emitting diodes) of the first embodiment. The abscissa represents a cutoff frequency in the unit of "MHz" and the ordinate represents a light emission output in the unit of "mW". A circle symbol in FIG. 13 corresponds to a light emitting diode of the first embodiment, and a triangle symbol corresponds to a conventional light emitting diode using Zn doped GaAs as the material of the active layer and AlGaAs as the material of the cladding layer.

In the case of conventional light emitting diodes, the cutoff frequency can be raised by increasing the Zn concentration of the active layer. However, as the cutoff frequency is raised, the light emission output lowers. In addition, it is difficult to set the cutoff frequency to 60 MHz or higher. In contrast, in the case of light emitting diodes of the first embodiment, it is possible to set the cutoff frequency to 60 MHz or higher, and even if the cutoff frequency is raised, the light emission output is not lowered.

Next, the second embodiment of the invention will be described. The cutoff frequency of a semiconductor light emitting device using an InGaAs strain quantum well layer can be improved by increasing, for example, the In composition ratio of the strain quantum well layer. It is, however, difficult to epitaxially grow an InGaAs strain quantum well layer having a large In composition ratio and a good quality on a GaAs substrate having a principal surface tilted from the (100) plane. If the In composition ratio is larger than 0.12, it is difficult to form an InGaAs layer having a good quality. If the In composition ratio is larger than 0.18, it is quite difficult to form an InGaAs layer having a good quality. In the second to fourth embodiments to be described below, various evaluations have been conducted in order to define the conditions of forming an InGaAs strain quantum well layer having a good quality.

In the second embodiment, evaluations were conducted for the steepness of a composition change at the interface between the InGaAs strain quantum well layer and GaAs barrier layer formed on a GaAs substrate.

Figure 14:
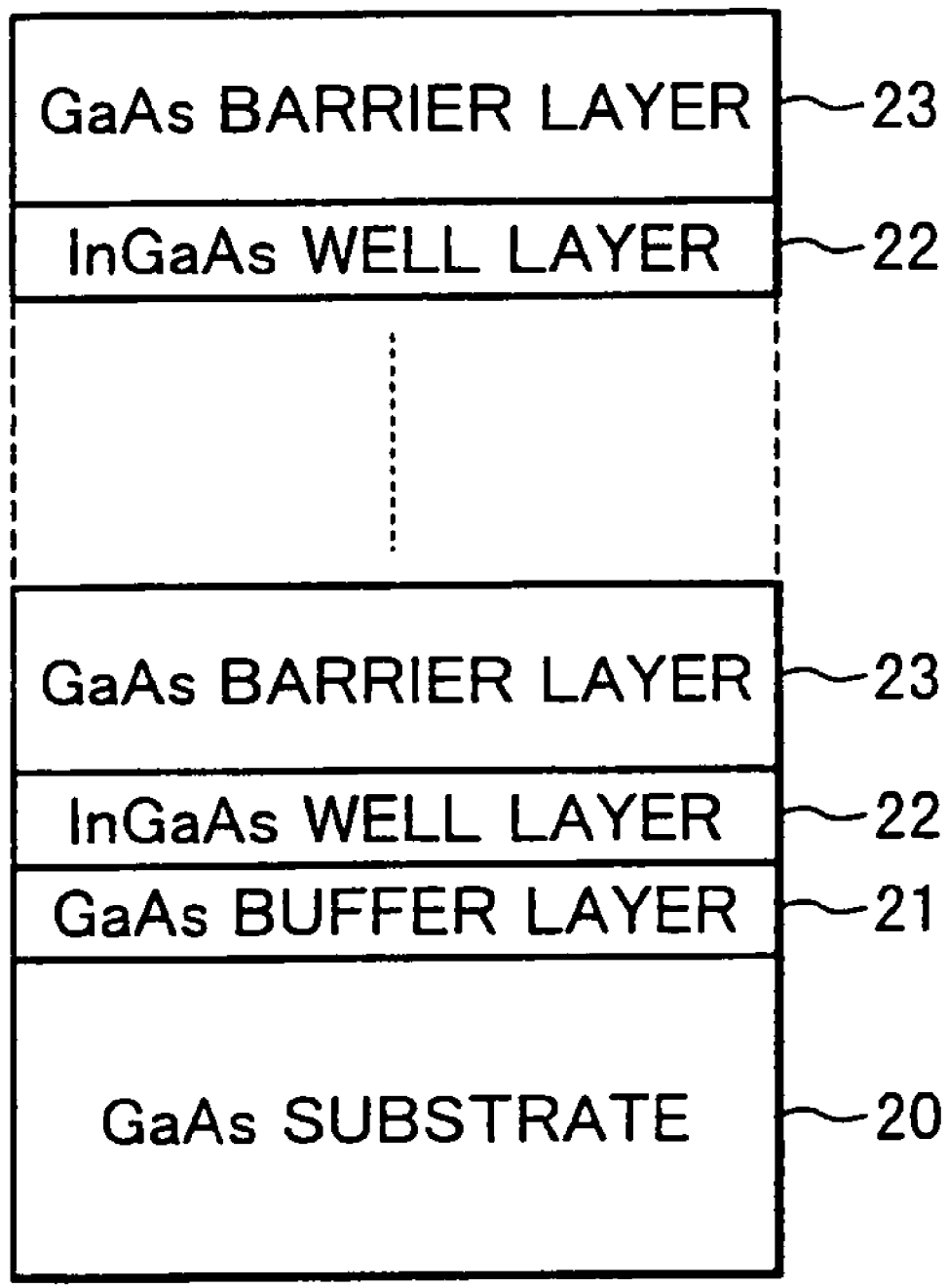
FIG. 14 is a cross sectional view of a sample manufactured according to a second embodiment.

FIG. 14 is a cross sectional view of an evaluation sample. The principal surface of a GaAs substrate 20 is formed with a GaAs buffer layer 21 of 0.2 μm thick by MOCVD. The surface of the buffer layer 21 is stacked with five cycles of a two-layer structure of an InGaAs strain quantum well layer 22 of 10 nm thick and a GaAs barrier layer 23 of 20 nm thick.

A plurality of samples were prepared which were subjected to different growth temperatures and had different In composition ratios of the strain quantum well layers 22 and different crystalline orientations of principal surfaces of the GaAs substrates 20. The growth temperature is one of 620° C., 650° C. and 700° C. The In composition ratio of the strain quantum well layer 22 is 0.12 or 0.18. The principal surface of the GaAs substrate 20 is one of a (100) just plane, a (100) plane 2°, 5° or 10° off to (toward) the (111)A plane and a (100) plane 2° or 5° off to (toward) the (110) plane. In this specification, the (100) just plane means the plane having an inclination angle of 0.2° or smaller with reference to the (100) plane.

FIG. 15 shows the measurement results of half band widths of satellite peaks of X-ray rocking curves corresponding to the (400) plane of the lamination structure of the strain quantum well layer 22 and barrier layer 23 of each sample. The abscissa of the graph of FIG. 15 represents a growth temperature of the strain quantum well layer 22 and barrier layer 23 in the unit of "° C." and the ordinate represents a half band width in the unit of "arcsec". A black square symbol in FIG. 15 corresponds to a sample using a substrate having the (100) just plane as its principal surface. A black rhomboid symbol, a black triangle symbol and a cross symbol correspond to samples using a substrate having the (100) plane 2°, 5° and 10° off to the (111)A plane as its principal surface, respectively. A white rhomboid symbol and a white triangle symbol correspond to a sample using a substrate having the (100) plane 2° and 5° off to the (110) plane, respectively. The In composition ratio of the strain quantum well layer 22 of each sample is 0.12. A plus symbol corresponds to a sample using a substrate which has the (100) just plane as its principal surface and has the strain quantum well layer 22 with the In composition ratio of 0.18.

In the case of the GaAs substrate which has the (100) just plane and has the strain quantum well layer 22 with the In composition ratio of 0.12, the half band width is 120 arcsec or narrower irrespective of the growth temperature, and a lamination structure having a high crystalline quality can be obtained. As the inclination angle of the principal surface of the substrate relative to the (100) plane becomes large, there is the tendency that the half band width becomes broad. This tendency is definite at the growth temperature of 700° C. The half band width becomes abruptly wide as the inclination angle relative to the (100) plane becomes 5° or larger.

The sample having the strain quantum well layer 22 with the In composition rate of 0.18 has the half band width greatly wider than that of the sample with the In composition ratio of 0.12.

Figure 16A:
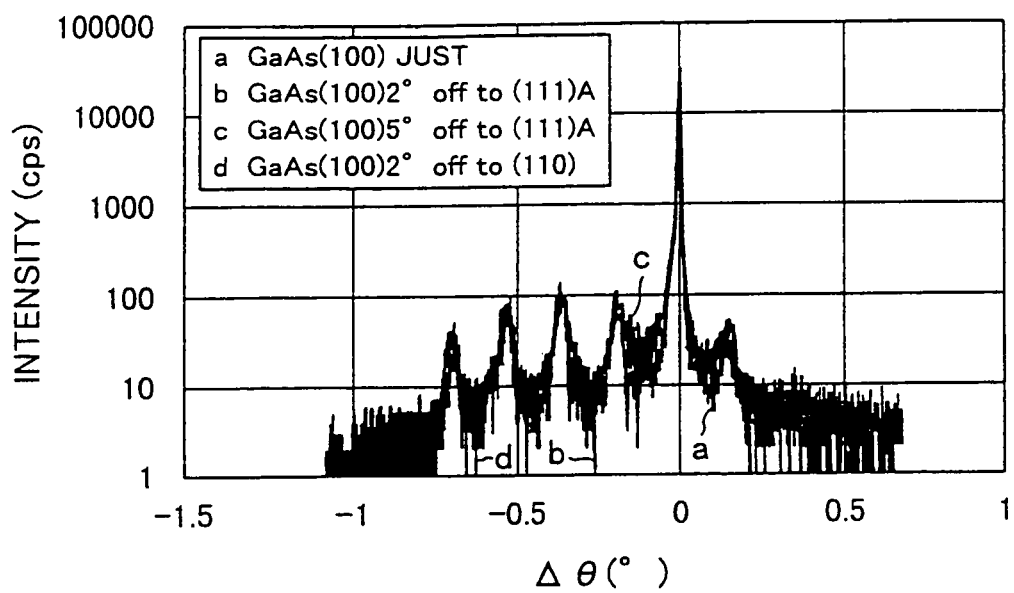
FIGS. 16A and 16B are graphs showing X-ray rocking curves of sample lamination structures manufactured according to the second embodiment.
Figure 16B:
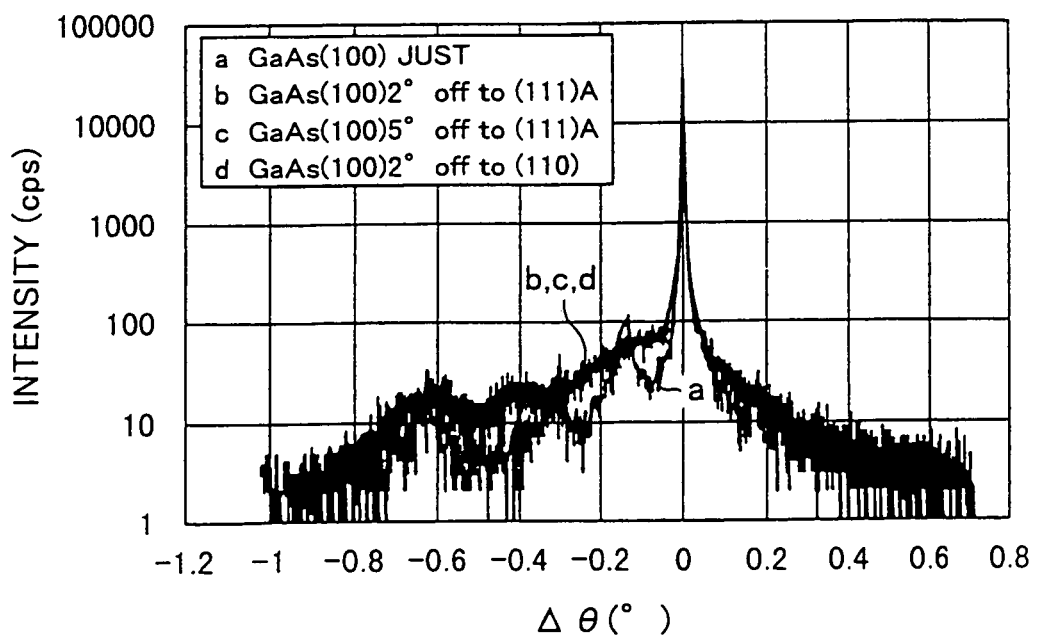

FIGS. 16A and 16B show X-ray rocking curves of samples formed at the growth temperature of 700° C. Solid lines a, b, c and d correspond to samples having as their principal surfaces the (100) just plane, the (100) plane 2° off to the (111)A plane, the (100) plane 5° off to the (111)A plane and the (100) plane 2° off to the (110) plane, respectively. Each sample shown in FIG. 16A has the strain quantum well layer 22 with the In composition ratio of 0.12, and each sample shown in FIG. 16B has the strain quantum well layer 22 with the In composition ratio of 0.18.

As shown in FIG. 16A, with the strain quantum well layer 22 having the In composition ratio of 0.12, four solid lines a to d are scarcely distinguished and all solid lines show clear satellite lines. As shown in FIG. 16B, with the strain quantum well layer 22 having the In composition ratio of 0.18, clear satellite peaks cannot be observed for the samples using the substrate with the plane other than the (100) just plane.

If AlGaAs is used as the material of the clad layer and carrier confinement layer of a semiconductor light emitting device, the growth temperature suitable for AlGaAs by MOCVD is 700° C. to 750° C. If the growth temperature is set lower than 700° C., the oxygen concentration at the interface between the strain quantum well layer and barrier layer increases and the device performance is degraded. It is therefore not preferable to set the growth temperature of the AlGaAs layer lower than 700° C.

If the growth temperature of InGaAs is set to 700° C. or higher, as seen from the measurement results shown in FIG. 15, it is preferable that the (100) just plane or the plane having an inclination angle of 20 or smaller relative to the (100) plane is used as the principal surface of the GaAs substrate. In this case, the In composition ratio of the strain quantum well layer is set to 0.12 or smaller.

Next, the third embodiment of the invention will be described. In the third embodiment, a plurality of samples were prepared which had the InGaAs strain quantum well layer formed on the GaAs substrate, and photoluminescence (PL) spectra were evaluated.

Figure 17:
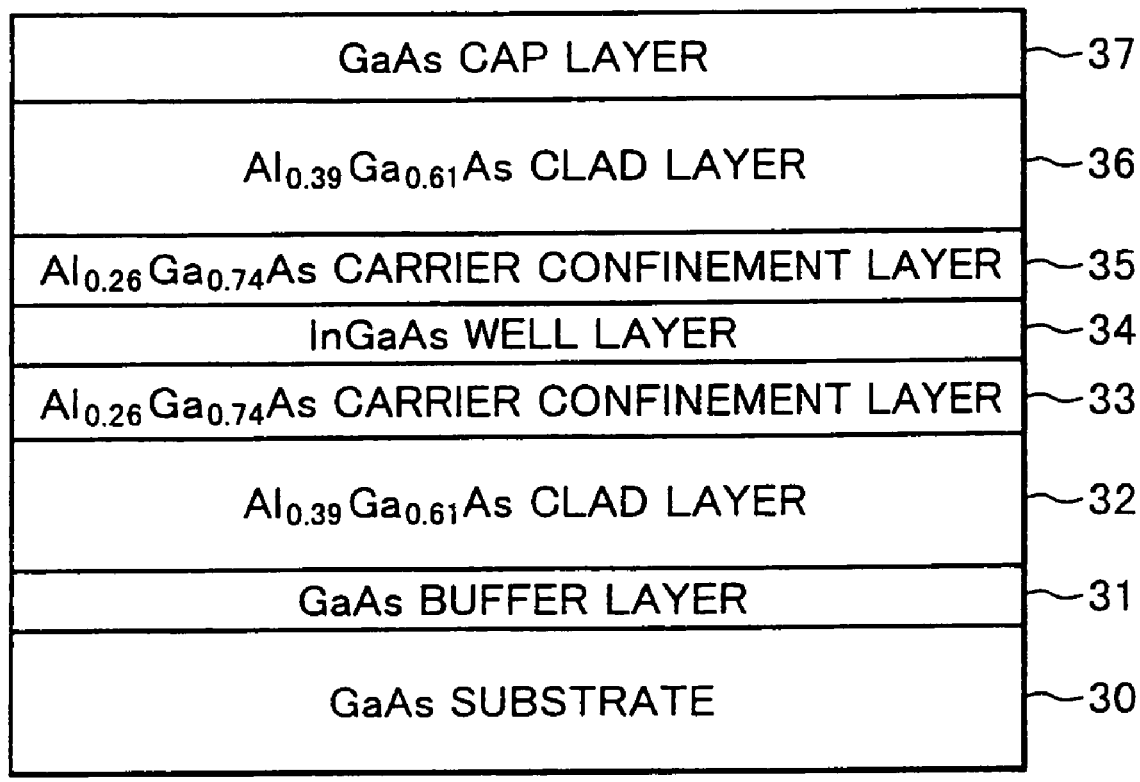
FIG. 17 is a cross sectional view of a sample manufactured according to a third embodiment.

FIG. 17 is a cross sectional view of a sample manufactured for the third embodiment. The principal surface of a GaAs substrate 30 is formed with a GaAs buffer layer 31 of 0.2 μm thick. Stacked on this buffer layer 31 are a lower clad layer 32, a lower carrier confinement layer 33, a strain quantum well layer 34, an upper carrier confinement layer 35, an upper clad layer 36 and a cap layer 37 in this order from the bottom. These layers were formed by MOCVD at the growth temperature of 650° C.

The lower and upper clad layers 32 and 36 are both made of $Al_{0.39}Ga_{0.61}As$ and their thicknesses are 1 μm and 150 nm, respectively. The lower and upper carrier confinement layers 33 and 35 are both made of $Al_{0.26}Ga_{0.74}As$ and their thicknesses are 50 nm. The strain quantum well layer 34 is made of InGaAs and its composition ratios and thickness change with each sample. The cap layer 37 is made of GaAs and has a thickness of 50 nm.

FIG. 18 shows the In composition ratio and thickness of the strain quantum well layer and the orientation of the substrate principal surface of each of samples A to L manufactured for the third embodiment.

Figure 19:
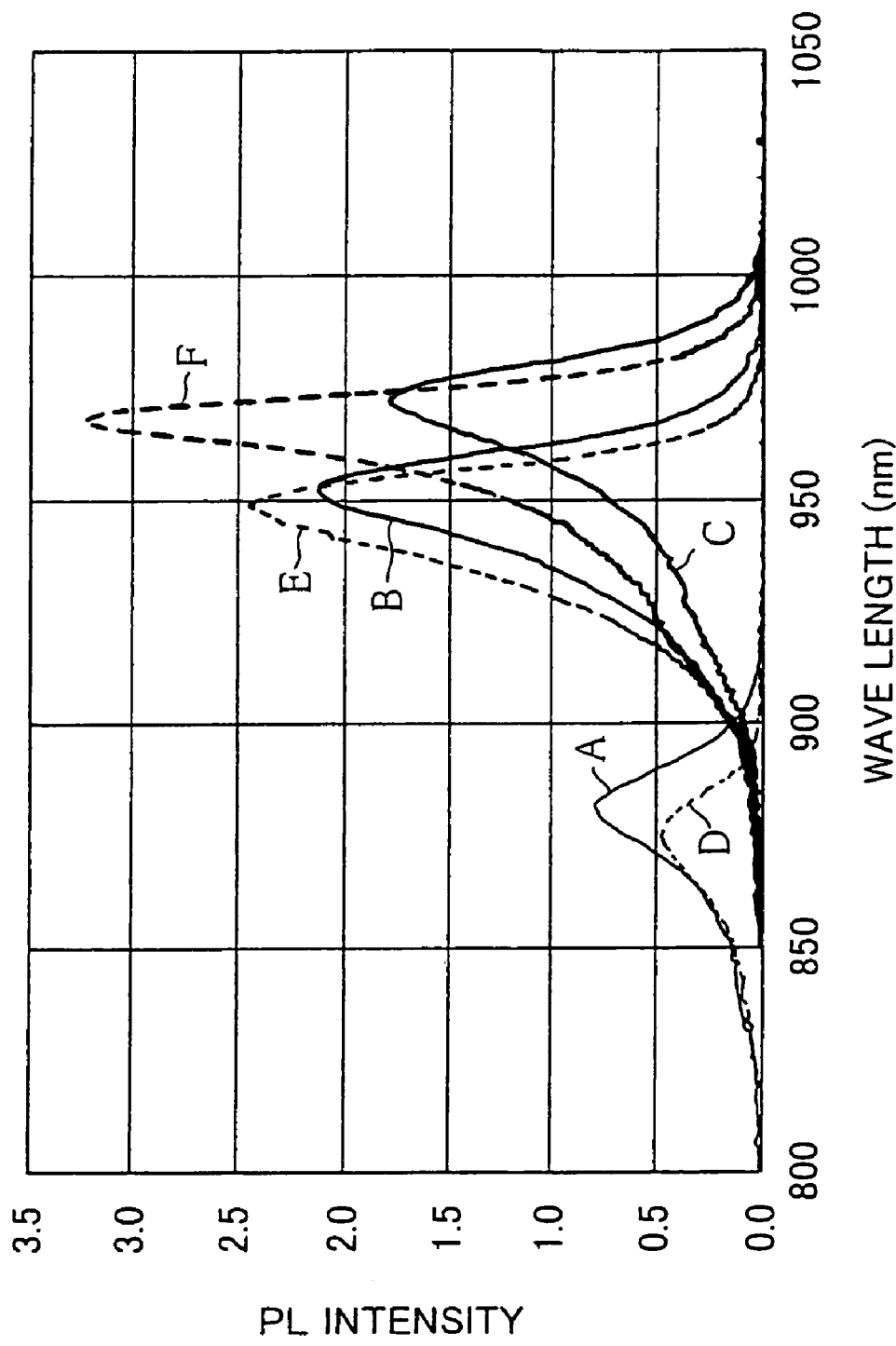
FIG. 19 is a graph showing PL spectra of the samples A to F of the third embodiment.
Figure 20:
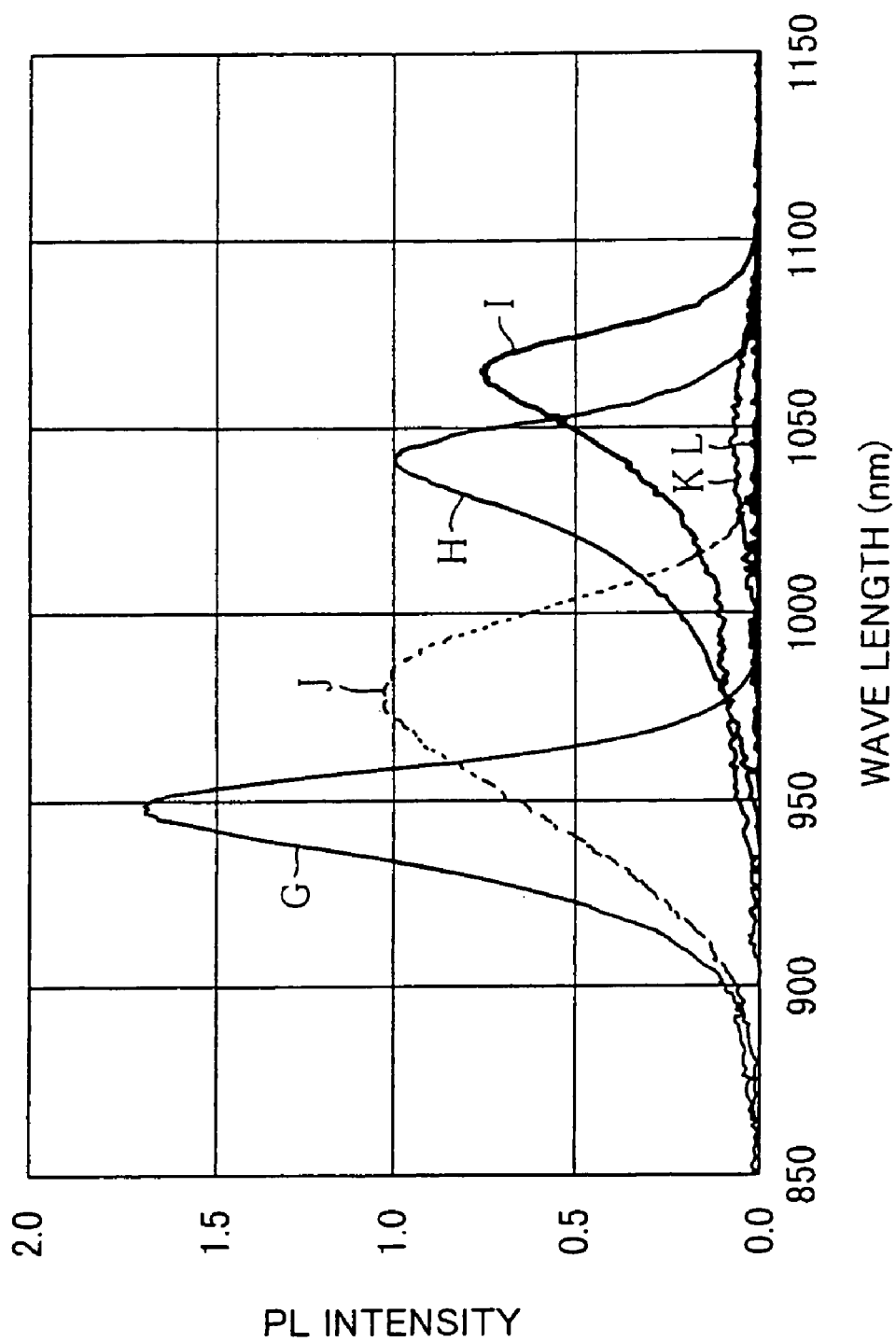
FIG. 20 is a graph showing PL spectra of the samples G to L of the third embodiment.

FIGS. 19 and 20 show PL spectra of the samples A to F and PL spectra of the samples G to L, respectively. The abscissa represents a wavelength in the unit of "nm" and the ordinate represents a PL intensity in an arbitrary unit. In all samples, light emission is observed corresponding to recombination of carriers at the first order quantum level.

As seen from FIGS. 19 and 20, the PL intensity of the samples K and L, which use the substrate having as the principal surface the plane inclined from the (100) plane and have the strain quantum well layer of 10 nm or 15 nm thick and an In composition ratio of 0.18, is very weak as compared to the PL intensity of the samples E and F having the In composition ratio of 0.12 and the same other conditions. Therefore, if the In composition of the strain quantum well layer 34 is set larger than 0.12, it is preferable to use the GaAs substrate having the (100) just plane.

Next, the fourth embodiment of the invention will be described. In the fourth embodiment, a plurality of samples (light emitting diodes) were prepared which had the InGaAs strain quantum well layer formed on the GaAs substrate, and electroluminescence (EL) spectra were evaluated.

Figure 21:
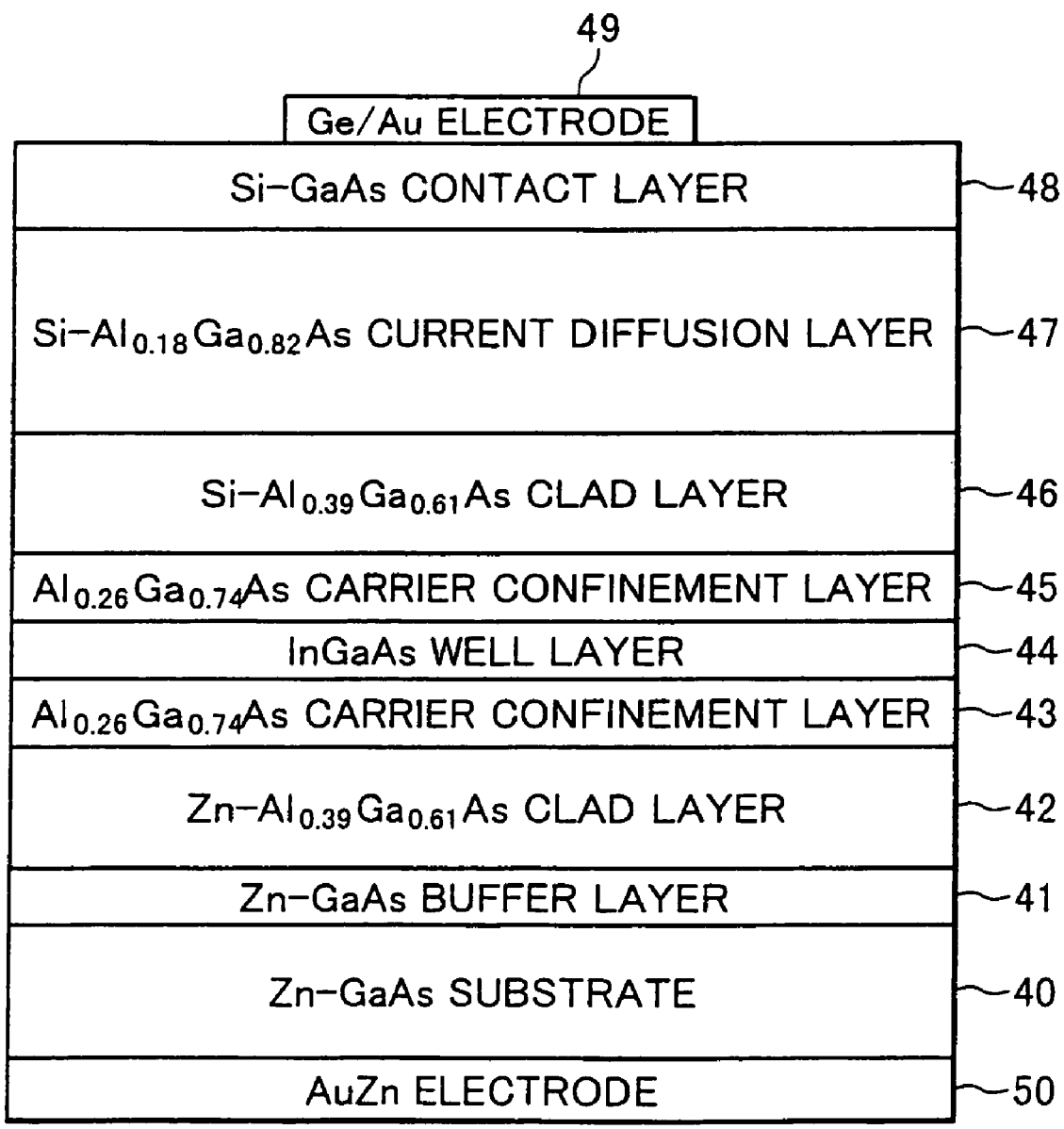
FIG. 21 is a cross sectional view of a sample manufactured according to a fourth embodiment.

FIG. 21 is a cross sectional view of a sample manufactured for the fourth embodiment. The principal surface of a GaAs substrate 40 is formed with a Zn doped GaAs buffer layer 41 of 0.2 μm thick. Stacked on this buffer layer 41 are a lower clad layer 42, a lower carrier confinement layer 43, a strain quantum well layer 44, an upper carrier confinement layer 45, an upper clad layer 46, a current diffusion layer 47 and a contact layer 48 in this order from the bottom. These layers were formed by MOCVD at the growth temperature of 700° C.

The lower clad layers 42 is made of Zn doped $Al_{0.39}Ga_{0.61}As$ and its thickness is 1 μm. The lower and upper carrier confinement layers 43 and 45 are both made of $Al_{0.26}Ga_{0.74}As$ and their thicknesses are 50 nm. The strain quantum well layer 44 is made of InGaAs and its composition ratios and thickness change with each sample. The upper clad layer 46 is made of Si doped $Al_{0.39}Ga_{0.61}As$ and its thickness is 1 μm. The current diffusion layer 47 is made of Si doped $Al_{0.18}Ga_{0.82}As$ and its thickness is 4.5 μm. The contact layer 48 is made of Si doped GaAs and its thickness is 50 nm.

The surface of the contact layer 48 is formed with an upper electrode 49. The upper electrode 49 is formed by vapor depositing a Ge film and an Au film and thereafter performing an alloying process. The back surface of the substrate 40 is formed with a lower electrode 50 made of AuZn alloy.

After this lamination structure is formed, a dicing process and a bonding process are performed. Each die is mounted on a stem to finish a light emitting diode.

FIG. 22 shows the orientation of the principal surface of the substrate, the In composition ratio and thickness of the InGaAs strain quantum well layer 44, the EL intensity, the half band width of the EL spectrum and the cutoff frequency, respectively of each of samples W to Z manufactured for the fourth embodiment.

Figure 23:
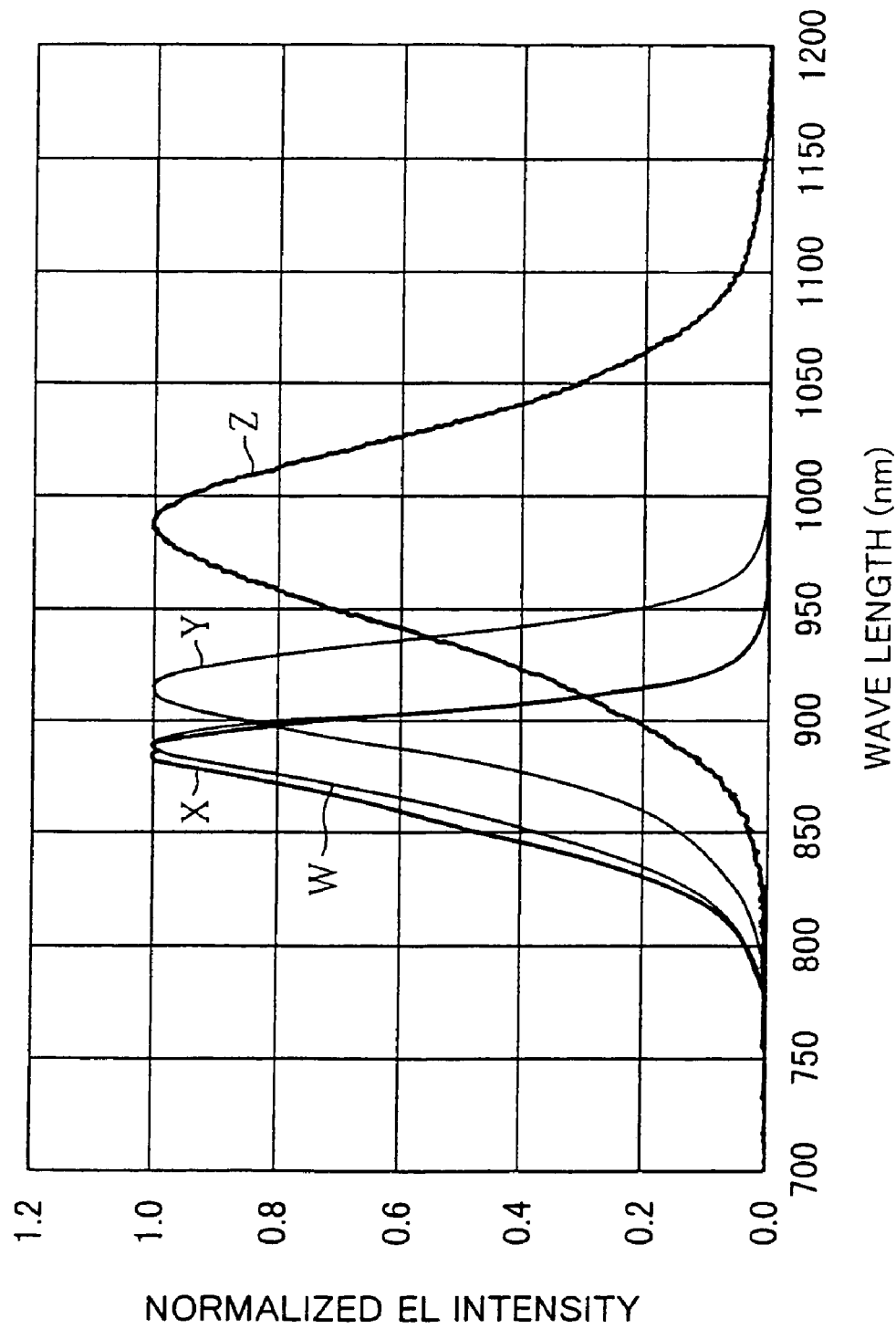
FIG. 23 is a graph showing normalized EL spectra of the samples manufactured according to the fourth embodiment.

FIG. 23 shows spectra of normalized EL intensities when a current of 50 mA is flowed through the samples W to Z. The abscissa represents a wavelength in the unit of "nm" and the ordinate represents a normalized EL intensity having the largest EL intensity set to "1". If the In composition ratio of the strain quantum well layer 44 is 0.12, the EL performance approximately equal to that when the GaAs substrate having the (100) just plane is used can be obtained even if the GaAs substrate having a principal surface inclined by 5° from the (100) plane is used, as seen from the measurement results of the samples W and X. The EL performance equal to that when the substrate having the (100) just plane is used can be expected if the plane has an inclination angle of 5° or smaller relative to the (100) plane.

As seem from the measurement results of the samples Y and Z, if the In composition ratio of the strain quantum well layer 44 is 0.25, the EL output lowers and the half wave width of the spectrum becomes wider when the GaAs substrate having the principal surface inclined from the (100) plane is used, as compared to those when the substrate having the (100) just plane is used. Therefore, if the In composition ratio is set larger than 0.12, it is preferable to use the substrate having the (100) just plane. In this case, if the In composition ratio is 0.25 or smaller, an expected EL performance can be obtained.

There was no significant difference between cutoff frequencies depending upon the orientation of the principal surface of a substrate.

Figure 24:
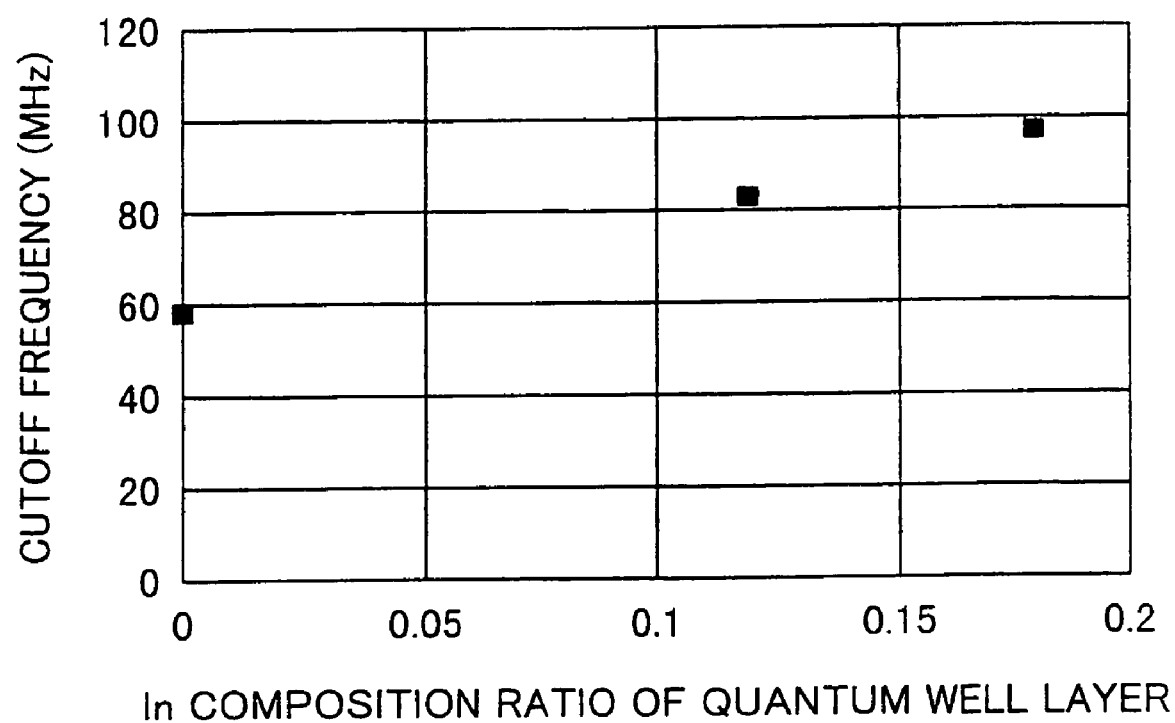
FIG. 24 is a graph showing the relation between an In composition ratio and a cutoff frequency of strain quantum wells.

FIG. 24 shows the relation between a cutoff frequency and an In composition ratio of the strain quantum well layer, respectively of the light emitting diode having the structure shown in FIG. 21. The abscissa represents the In composition ratio and the ordinate represents a cutoff frequency in the unit of "MHz". It can be seen that as the In composition ratio increases, the cutoff frequency becomes high.

In order to raise the cutoff frequency of a semiconductor light emitting device having an InGaAs strain quantum well layer, it is effective to make large the In composition ratio of the strain quantum well layer. However, as in the embodiments described above, it is difficult to grow an InGaAs layer having a large In composition ratio and a good quality on a GaAs substrate having a principal surface inclined from the (100) plane. An InGaAs layer having a good quality can be formed by matching the orientation of the principal surface of a substrate and the In composition ratio of a strain quantum well layer, with the preferable conditions determined from the evaluations of the second to fourth embodiments.

In the second to fourth embodiments, GaAs is used as the substrate material. Similar to the first embodiment using the AlGaAs substrate, the cutoff frequency can be improved by adopting the preferred constituent conditions of the clad layer, carrier confinement layer and strain quantum well layer of a semiconductor light emitting device.

The preferred orientation of a substrate and the preferred In composition ratio of a strain quantum well layer described with reference to the second to fourth embodiments are expected to be applied to the case that a substrate made of group III-V compound semiconductor (including mixed crystal semiconductor such as AlGaAs) is used. In the second to fourth embodiments, although the strain quantum well layer is made of InGaAs, the preferred orientation of a substrate and the preferred In composition ratio of a strain quantum well layer are expected to be applied to group III-V mixed crystal semiconductor containing In, such as InGaAlAs.

The present invention has been described in connection with the preferred embodiments. The invention is not limited only to the above embodiments. It is apparent that various modifications, improvements, combinations, and the like can be made by those skilled in the art.

What is claimed is:

1. A semiconductor light emitting device comprising:
 (i) a support substrate made of a first semiconductor material;
 (ii) a light emitting lamination structure disposed on the support substrate, the light emitting lamination structure comprising:
  a quantum well layer made of a second semiconductor material;
  a pair of carrier confinement layers made of a third semiconductor material having a band gap wider than a band gap of the second semiconductor material, said pair of carrier confinement layers sandwiching the quantum well layer; and
  a pair of clad layers made of a fourth semiconductor material having a band gap wider than the band gap of the third semiconductor material, said pair of clad layers sandwiching the pair of carrier confinement layers;
  wherein a composition of the second semiconductor material, a composition of the third semiconductor material, and thicknesses of the quantum well layer and the carrier confinement layers are set such that light emission recombination of electrons and holes occurs in the quantum well layer and light emission recombination does not occur in the carrier confinement layers when current flows through the light emitting lamination structure; and (iii) electrodes for injecting carriers into the light emitting lamination structure.

2. A semiconductor light emitting device comprising:
(i) a support substrate which is made of a group III-V compound semiconductor material, and which has a principal surface that is one of a (100) plane and a crystalline plane having an inclination angle of not more than 2° from the (100) plane;
(ii) a light emitting lamination structure disposed on the principal surface of the support substrate, the light emitting lamination structure comprising:
a quantum well layer made of a group III-V mixed crystal semiconductor material containing In;
a pair of carrier confinement layers made of a semiconductor material having a band gap wider than a band gap of the semiconductor material of the quantum well layer, said pair of carrier confinement layers sandwiching the quantum well layer; and
a pair of clad layers made of a semiconductor material having a band gap wider than the band gap of the semiconductor material of the carrier confinement layers, said pair of clad layers sandwiching the pair of carrier confinement layers;
wherein a composition of the semiconductor material of the quantum well layer, a composition of the semiconductor material of the carrier confinement layers, and thicknesses of the quantum well layer and the carrier confinement layers are set such that light emission recombination of electrons and holes occurs in the quantum well layer and light emission recombination does not occur in the carrier confinement layers; and
(iii) electrodes for injecting carriers into the light emitting lamination structure.

3. A semiconductor light emitting device according to claim 2, wherein the support substrate is made of GaAs and the quantum well layer is made of InGaAs.

4. A semiconductor light emitting device according to claim 2, wherein an In composition ratio of the quantum well layer is not more than 0.12.

5. A semiconductor light emitting device comprising:
(i) a support substrate which is made of a group III-V compound semiconductor material, and which has a principal surface that is one of a (100) plane and a crystalline plane having an inclination angle of not more than 0.2° from the (100) plane;
(ii) a light emitting lamination structure disposed on the principal surface of the support substrate, the light emitting lamination structure comprising:
a quantum well layer made of a group III-V mixed crystal semiconductor material containing In;
a pair of carrier confinement layers made of a semiconductor material having a band gap wider than a band gap of the semiconductor material of the quantum well layer, said pair of carrier confinement layers sandwiching the quantum well layer; and
a pair of clad layers made of a semiconductor material having a band gap wider than the band gap of the semiconductor material of the carrier confinement layers, said pair of clad layers sandwiching the pair of carrier confinement layers;
wherein a composition of the semiconductor material of the quantum well layer, a composition of the semiconductor material of the carrier confinement layers, and thicknesses of the quantum well layer and the carrier confinement layers are set such that light emission recombination of electrons and holes occurs in the quantum well layer and light emission recombination does not occur in the carrier confinement layers when current flows through the light emitting lamination structure; and
(iii) electrodes for injecting carriers into the light emitting lamination structure.

6. A semiconductor light emitting device according to claim 5, wherein the support substrate is made of GaAs, the quantum well layer is made of InGaAs, and an In composition ratio of the quantum well layer is not more than 0.25.

7. A semiconductor light emitting device comprising:
(i) a support substrate which is made of a group III-V compound semiconductor material, and which has a principal surface that is one of a (100) plane and a crystalline plane having an inclination angle of not more than 5° from the (100) plane;
(ii) a light emitting lamination structure disposed on the principal surface of the support substrate, the light emitting lamination structure comprising:
a quantum well layer made of a group III-V mixed crystal semiconductor material containing In and having an In composition ratio of not more than 0.12;
a pair of carrier confinement layers made of a semiconductor material having a band gap wider than a band gap of the semiconductor material of the quantum well layer, said pair of carrier confinement layers sandwiching the quantum well layer; and
a pair of clad layers made of a semiconductor material having a band gap wider than the band gap the semiconductor material of the carrier confinement layers, said pair of clad layers sandwiching the pair of carrier confinement layers;
wherein a composition of the semiconductor material of the quantum well layer, a composition of the semiconductor material of the carrier confinement layers, and thicknesses of the quantum well layer and the carrier confinement layers are set such that light emission recombination of electrons and holes occurs in the quantum well layer and light emission recombination does not occur in the carrier confinement layers; and
(iii) electrodes for injecting carriers into the light emitting lamination structure.

* * * * *